United States Patent
Seaton

(10) Patent No.: US 9,966,837 B1
(45) Date of Patent: May 8, 2018

(54) POWER CONVERTER WITH CIRCUITS FOR PROVIDING GATE DRIVING

(71) Applicant: VPT, Inc., Blacksburg, VA (US)

(72) Inventor: Kevin L. Seaton, Blacksburg, VA (US)

(73) Assignee: VPT, INC., Blacksburg, VA (US)

( * ) Notice: Subject to any disclaimer, the term of this patent is extended or adjusted under 35 U.S.C. 154(b) by 0 days. days.

(21) Appl. No.: 15/644,257

(22) Filed: Jul. 7, 2017

Related U.S. Application Data

(60) Provisional application No. 62/360,315, filed on Jul. 8, 2016.

(51) Int. Cl.
  *H02M 1/08* (2006.01)
  *H02M 1/32* (2007.01)
  *H03K 17/691* (2006.01)
  *H02M 3/335* (2006.01)

(52) U.S. Cl.
  CPC .............. *H02M 1/32* (2013.01); *H02M 1/08* (2013.01); *H03K 17/691* (2013.01); *H02M 3/33546* (2013.01)

(58) Field of Classification Search
  CPC ............ H02M 1/08–1/088; H02M 2001/0048; H02M 1/32; H02M 2001/0054; H03K 17/691; H03K 17/61; H03K 7/08
  See application file for complete search history.

(56) References Cited

U.S. PATENT DOCUMENTS

| | | |
|---|---|---|
| 4,052,623 A | 10/1977 | Loberg |
| 4,293,874 A | 10/1981 | Reneau |
| 4,423,341 A | 12/1983 | Shelly |
| 4,430,608 A | 2/1984 | Nesler |
| 4,438,356 A | 3/1984 | Fleischer |
| 4,454,430 A | 6/1984 | Miller |
| 4,461,966 A | 7/1984 | Hebenstreit |
| 4,511,815 A | 4/1985 | Wood |

(Continued)

OTHER PUBLICATIONS

"Switch-Mode Power Supply Reference Manual", SCILLC, Apr. 2014.

(Continued)

*Primary Examiner* — Gustavo Rosario Benitez
(74) *Attorney, Agent, or Firm* — New River Valley IP Law, PC; Michele L. Mayberry; Mark Douma

(57) ABSTRACT

A switched mode power supply is provided comprising a pulse-width-modulator (PWM), a power section, and a drive section for the power switch. The drive section consists of a new method of driving the power switch where it is desired that the switch terminals be isolated from the PWM ground. The new driver design, which incorporates a small isolation transformer along with unique modifications to the traditional DC restore circuit, is directed to solving problems when PWM type switching power supplies encounter fault conditions such as a short circuit across their output as well as protecting the switch and the load when an ordinary shutdown or disable command is received. One problem that arises with switch drivers that utilize isolation transformers during an overload event or even an ordinary shutdown event is that the driver does not turn off and hold off the power switch when it is commanded to do so. This invention solves these problems by insuring that the appropriate components are de-energized in the classical dc-restore circuit which will prevent the PWM from losing control of the power switch.

24 Claims, 18 Drawing Sheets

(56) References Cited

U.S. PATENT DOCUMENTS

| | | |
|---|---|---|
| 4,672,300 A | 6/1987 | Harper |
| 4,748,351 A | 5/1988 | Barzegar |
| 4,769,588 A | 9/1988 | Panther |
| 4,792,746 A | 12/1988 | Josephson et al. |
| 4,947,311 A | 8/1990 | Peterson |
| 4,967,101 A | 10/1990 | Nakamura et al. |
| 4,970,420 A | 11/1990 | Billings |
| 5,019,719 A | 5/1991 | King |
| 5,144,547 A | 9/1992 | Masamoto |
| 5,168,182 A | 12/1992 | Salerno et al. |
| 5,264,736 A | 11/1993 | Jacobson |
| 5,404,059 A | 4/1995 | Loffler |
| 5,438,294 A | 8/1995 | Smith |
| 5,469,098 A | 11/1995 | Johnson |
| 5,481,219 A | 1/1996 | Jacobs et al. |
| 5,485,076 A | 1/1996 | Schoenwald et al. |
| 5,572,416 A | 11/1996 | Jacobs et al. |
| 5,594,378 A | 1/1997 | Kruse et al. |
| 5,635,867 A | 6/1997 | Timm |
| 5,684,681 A | 11/1997 | Huh |
| 5,724,235 A | 3/1998 | Shimamori et al. |
| 5,763,962 A | 6/1998 | Tsurumi |
| 5,786,687 A | 7/1998 | Faulk |
| 5,912,810 A * | 6/1999 | Jacobs .............. H03K 17/162 363/20 |
| 5,959,493 A | 9/1999 | Cassista |
| 5,963,078 A | 10/1999 | Wallace |
| 5,999,433 A | 12/1999 | Hua et al. |
| 6,005,780 A | 12/1999 | Hua |
| 6,016,258 A | 1/2000 | Jain et al. |
| 6,038,145 A | 3/2000 | Jacobs et al. |
| 6,084,792 A | 7/2000 | Chen et al. |
| 6,094,087 A | 7/2000 | He et al. |
| 6,107,860 A | 8/2000 | Vinciarelli |
| 6,144,193 A | 11/2000 | Illingworth |
| 6,233,164 B1 | 5/2001 | Zee et al. |
| 6,246,598 B1 | 6/2001 | Tarter et al. |
| 6,344,768 B1 | 2/2002 | Daun-Lindberg et al. |
| 6,496,047 B1 | 12/2002 | Iskander et al. |
| 6,580,626 B2 | 6/2003 | Takegami |
| 6,677,738 B1 | 1/2004 | Hesse |
| 6,771,518 B2 | 8/2004 | Orr et al. |
| 6,777,827 B1 | 8/2004 | Klemt et al. |
| 6,801,071 B1 | 10/2004 | Shizuki |
| 6,807,071 B1 | 10/2004 | Zhang et al. |
| 6,836,161 B2 | 12/2004 | Akiyama et al. |
| 7,006,364 B2 | 2/2006 | Jin et al. |
| 7,113,379 B2 | 9/2006 | Matsumoto |
| 7,113,412 B2 | 9/2006 | Shao et al. |
| 7,236,041 B2 | 6/2007 | Kim et al. |
| 7,251,113 B1 | 7/2007 | Batarseh et al. |
| 7,593,200 B2 | 9/2009 | Wu et al. |
| 7,596,009 B2 | 9/2009 | Matsumoto |
| 7,750,720 B2 | 7/2010 | Dittrich |
| 7,777,370 B2 | 8/2010 | Kojori et al. |
| 7,869,231 B2 | 1/2011 | Cohen |
| 7,893,676 B2 | 2/2011 | Hanna |
| 7,948,720 B2 | 5/2011 | Mok et al. |
| 7,994,827 B2 | 8/2011 | Williams |
| 7,999,523 B1 | 8/2011 | Caffee et al. |
| 8,004,344 B2 | 8/2011 | Morong et al. |
| 8,063,670 B2 | 11/2011 | Sutardja |
| 8,416,589 B2 | 4/2013 | Portisch |
| 8,451,626 B2 | 5/2013 | Coleman |
| 8,456,198 B2 | 6/2013 | Summer |
| 8,471,604 B2 | 6/2013 | Permuy et al. |
| 8,502,572 B2 | 8/2013 | Chiba et al. |
| 8,508,205 B2 | 8/2013 | Paul et al. |
| 8,526,206 B2 | 9/2013 | Fotherby |
| 8,611,118 B2 | 12/2013 | Yao et al. |
| 8,680,837 B2 | 3/2014 | Zeng et al. |
| 8,686,761 B2 | 4/2014 | Ozawa |
| 8,810,287 B2 | 8/2014 | Hayashi et al. |
| 8,816,653 B2 | 8/2014 | Nuebling et al. |
| 8,816,666 B2 | 8/2014 | Kimura |
| 8,829,949 B2 | 9/2014 | Zajc |
| 8,860,470 B1 | 10/2014 | Park |
| 8,860,471 B2 | 10/2014 | Xu et al. |
| 8,866,516 B2 | 10/2014 | Nagai et al. |
| 8,873,262 B2 | 10/2014 | Ide |
| 9,112,422 B1 | 8/2015 | Vinciarelli |
| 9,112,498 B2 | 8/2015 | Li et al. |
| 9,203,311 B2 | 12/2015 | Penzo et al. |
| 9,231,471 B2 | 1/2016 | Cuk |
| 9,256,238 B1 | 2/2016 | Kotikalapoodi |
| 9,276,437 B2 | 3/2016 | Partovi et al. |
| 9,337,738 B2 | 5/2016 | Gillmor et al. |
| 9,337,740 B2 | 5/2016 | Myhre et al. |
| 9,362,963 B2 | 6/2016 | Nagai et al. |
| 9,367,386 B2 | 6/2016 | Kaeriyama |
| 9,369,126 B1 | 6/2016 | Dunton et al. |
| 9,438,230 B2 | 9/2016 | Nagai et al. |
| 9,438,231 B2 | 9/2016 | Nagai |
| 9,455,704 B2 | 9/2016 | Nuebling et al. |
| 9,473,132 B2 | 10/2016 | Brinlee |
| 9,484,906 B2 | 11/2016 | Kohout |
| 9,490,711 B2 | 11/2016 | Klesyk et al. |
| 9,490,797 B2 | 11/2016 | Tabata et al. |
| 9,494,964 B2 | 11/2016 | Kawai et al. |
| 9,496,857 B2 | 11/2016 | Zajc |
| 9,496,862 B2 | 11/2016 | Ridder |
| 9,525,412 B2 | 12/2016 | Mavretic |
| 9,537,382 B2 | 1/2017 | Thalheim et al. |
| 9,543,856 B2 | 1/2017 | Suzuki |
| 9,548,664 B2 | 1/2017 | Yabumoto et al. |
| 9,564,948 B2 | 2/2017 | Arnold et al. |
| 9,568,451 B2 | 2/2017 | Zhong et al. |
| 9,576,725 B2 | 2/2017 | Glaser et al. |
| 9,590,621 B2 | 3/2017 | Young |
| 9,602,028 B2 | 3/2017 | Hensel et al. |
| 9,614,512 B2 | 4/2017 | Kim et al. |
| 9,632,135 B2 | 4/2017 | Yanagishima et al. |
| 9,667,228 B2 | 5/2017 | Bhagavatula et al. |
| 9,673,809 B1 | 6/2017 | Kandah et al. |
| 9,673,811 B2 | 6/2017 | Kim et al. |
| 9,673,812 B2 | 6/2017 | Takano |
| 9,673,816 B2 | 6/2017 | Cong et al. |
| 9,680,467 B2 | 6/2017 | Liu |
| 2002/0175719 A1 | 11/2002 | Cohen |
| 2003/0164721 A1 | 9/2003 | Reichard |
| 2004/0251951 A1 | 12/2004 | Beck |
| 2005/0254267 A1 | 11/2005 | Turvey |
| 2006/0076999 A1 | 4/2006 | Summer |
| 2006/0077696 A1 | 4/2006 | Summer |
| 2007/0133144 A1 | 6/2007 | Lewis |
| 2007/0195556 A1 | 8/2007 | Nakamura et al. |
| 2008/0112192 A1 * | 5/2008 | Nishikawa ............ H02M 1/08 363/17 |
| 2009/0167081 A1 | 7/2009 | Chen |
| 2009/0167412 A1 | 7/2009 | Morong |
| 2010/0052768 A1 | 3/2010 | Morong et al. |
| 2010/0218708 A1 | 9/2010 | Carr et al. |
| 2011/0019454 A1 * | 1/2011 | Fotherby .............. H02M 1/08 363/132 |
| 2011/0285447 A1 | 11/2011 | Nakanishi |
| 2012/0008344 A1 * | 1/2012 | Zeng ............ H03K 17/6877 363/21.11 |
| 2013/0009674 A1 * | 1/2013 | Reese ............ H03K 3/0315 327/109 |
| 2013/0063184 A1 | 3/2013 | Liang et al. |
| 2014/0140102 A1 | 5/2014 | Duan et al. |
| 2014/0191784 A1 | 7/2014 | Hatanaka et al. |
| 2014/0367563 A1 * | 12/2014 | Zhong ............ H03K 17/102 250/281 |
| 2015/0124507 A1 | 5/2015 | Ridder |
| 2016/0054265 A1 | 2/2016 | Zhong et al. |
| 2016/0079871 A1 | 3/2016 | Wang et al. |
| 2016/0173068 A1 | 6/2016 | Kim et al. |
| 2016/0191053 A1 * | 6/2016 | Esmaeili ............ H03K 17/61 327/109 |
| 2016/0218708 A1 | 7/2016 | Negoro |
| 2016/0222939 A1 | 8/2016 | Tang et al. |
| 2016/0241234 A1 | 8/2016 | Mavretic |
| 2016/0301409 A1 | 10/2016 | Cong et al. |

(56) References Cited

U.S. PATENT DOCUMENTS

| | | |
|---|---|---|
| 2016/0329889 A1 | 11/2016 | Lee et al. |
| 2017/0005652 A1 | 1/2017 | Hatano et al. |
| 2017/0012551 A1 | 1/2017 | Kondo et al. |
| 2017/0012622 A1 | 1/2017 | Peter et al. |
| 2017/0012672 A1 | 1/2017 | Peter et al. |
| 2017/0033686 A1 | 2/2017 | Cadilhon et al. |
| 2017/0033787 A1 | 2/2017 | Brinlee |
| 2017/0040994 A1 | 2/2017 | Chen |
| 2017/0047926 A1 | 2/2017 | Chen |
| 2017/0070220 A1 | 3/2017 | Yoshida et al. |
| 2017/0070221 A1 | 3/2017 | Thalheim et al. |
| 2017/0070354 A1 | 3/2017 | Ragonese et al. |
| 2017/0085188 A1 | 3/2017 | Foresta et al. |
| 2017/0104469 A1 | 4/2017 | Mavretic |

OTHER PUBLICATIONS

U.S. Appl. No. 12/334,692, Non-Final Office Action dated Oct. 15, 2010, 13 pages.
U.S. Appl. No. 13/106,219, Final Office Action dated Dec. 26, 2013, 8 pages.
Bell, Bob, "Gate Drive Transformers vs. Fully Integrated Isolators in Isolated DC-DC Power Converters", EE Times, Mar. 2010.
Ridley, Ray. "Gate Drive Design Tips", Power Systems Design Europe Dec. 2006, p. 16-18.
Walter E Milberger et al., United States Statutory Invention Registration No. H275, "Pulse Modulator", May 5, 1987.

\* cited by examiner

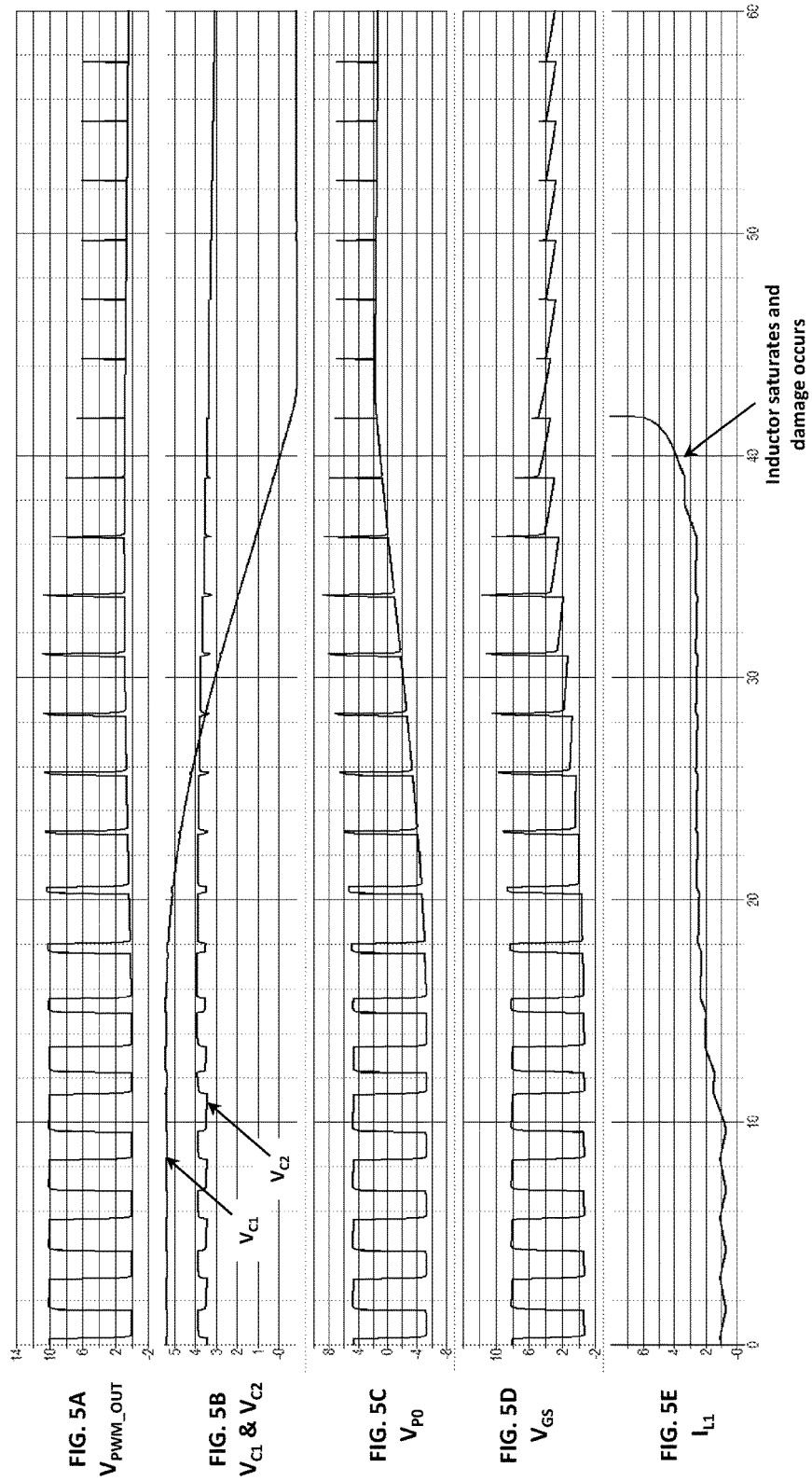

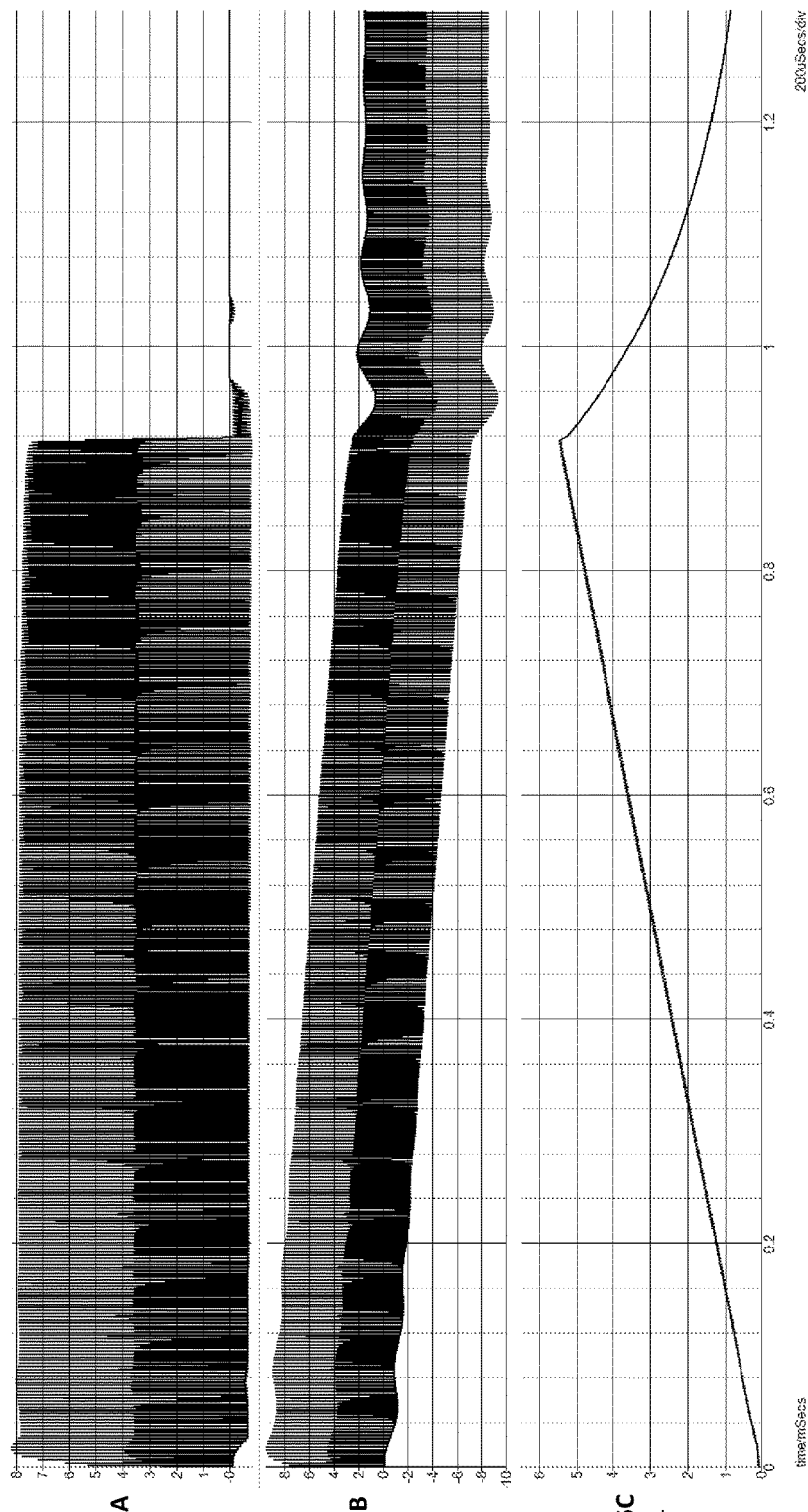

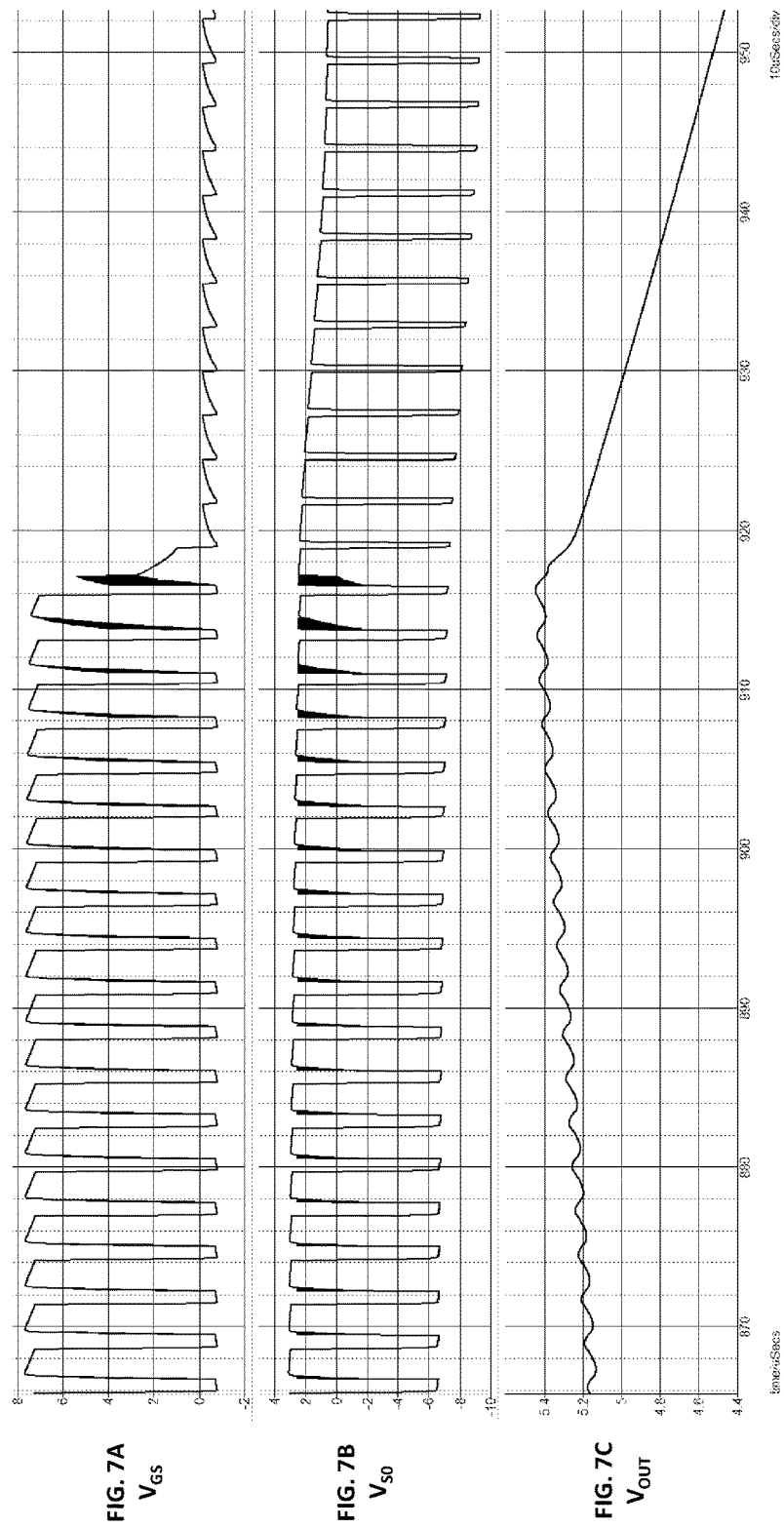

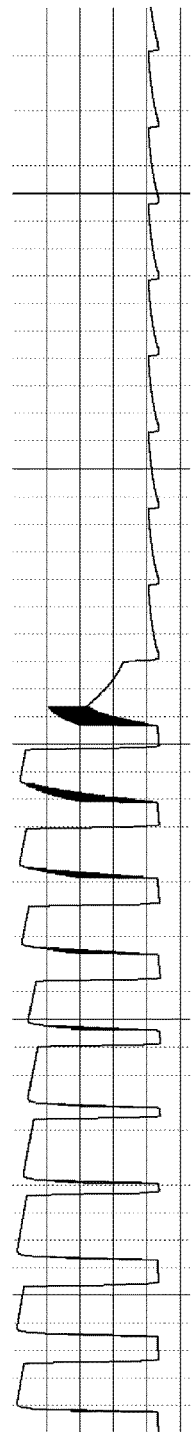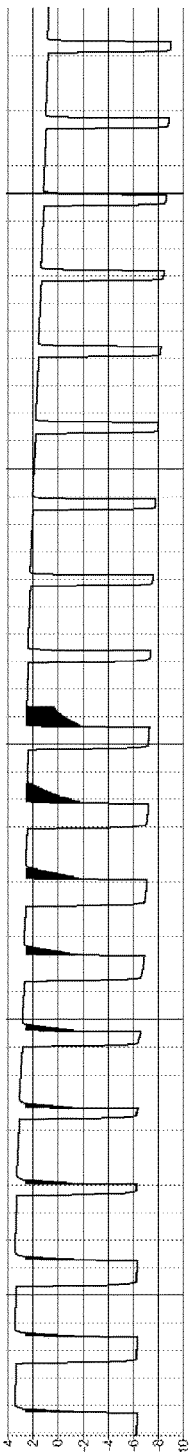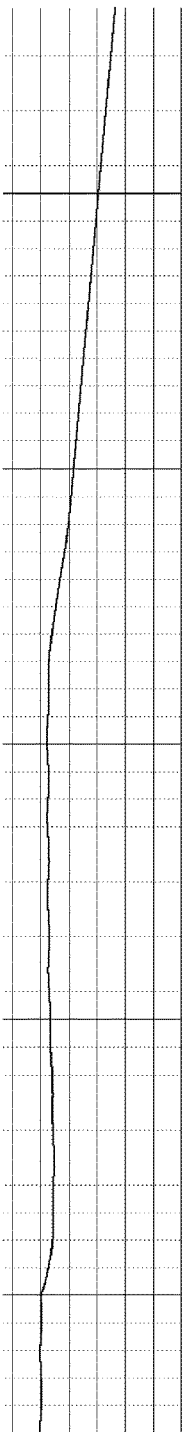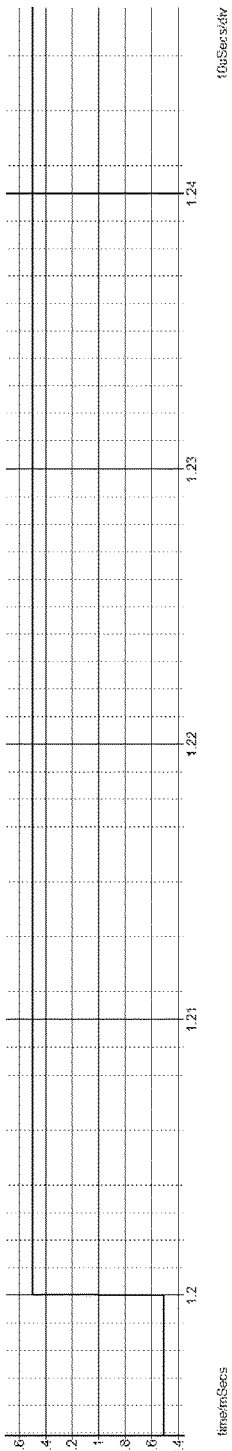

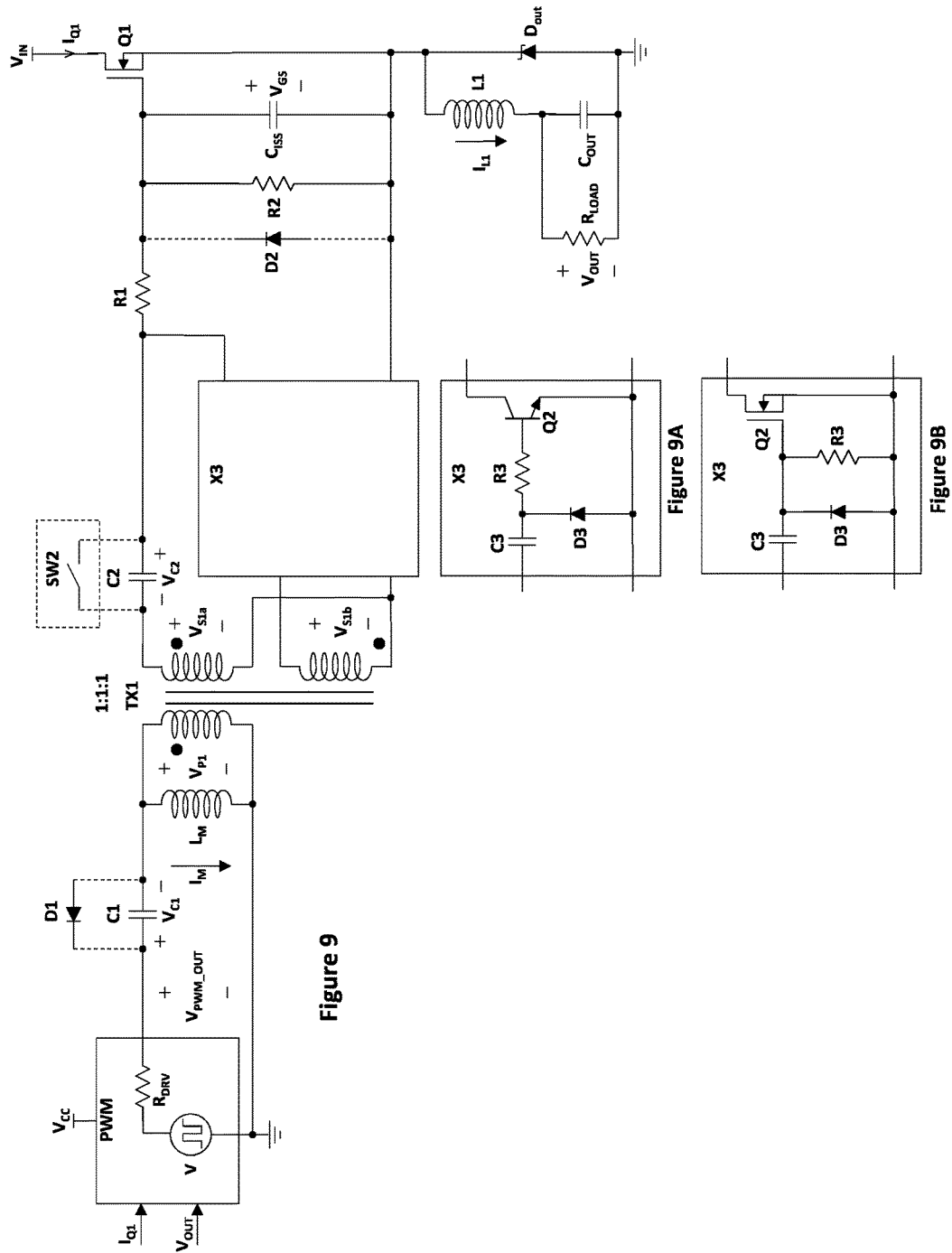

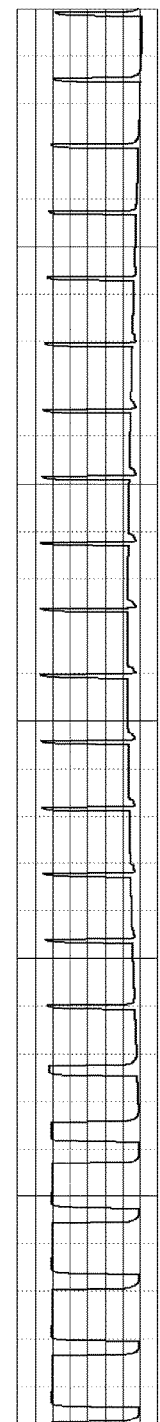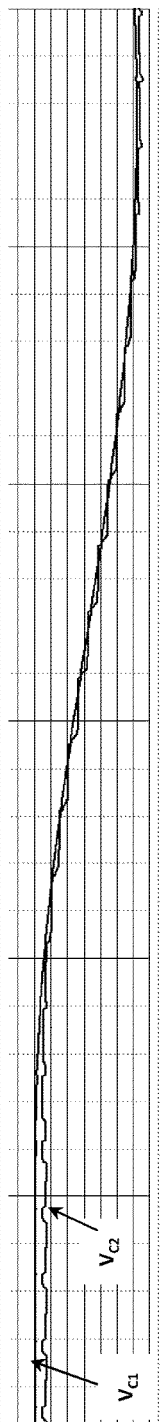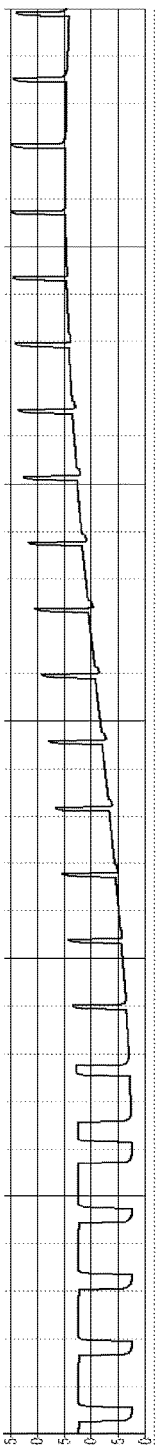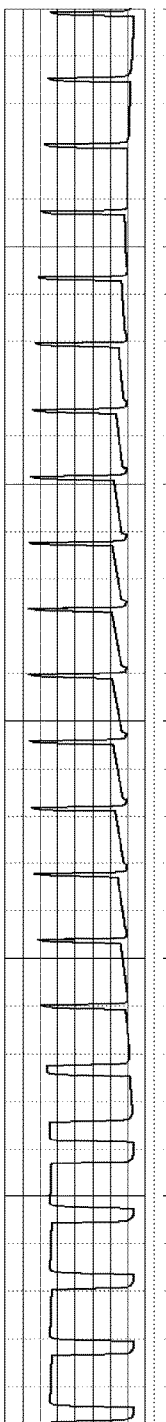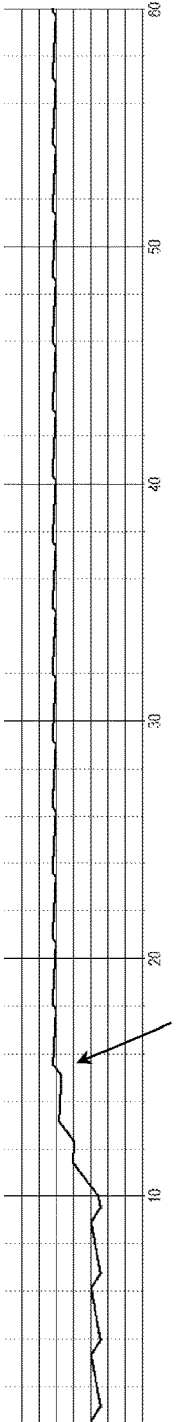
FIG. 10A $V_{PWM\_OUT}$
FIG. 10B $V_{C1}$ & $V_{C2}$
FIG. 10C $V_{P1}$
FIG. 10D $V_{GS}$
FIG. 10E $I_{L1}$
Inductor current is controlled and never saturates.

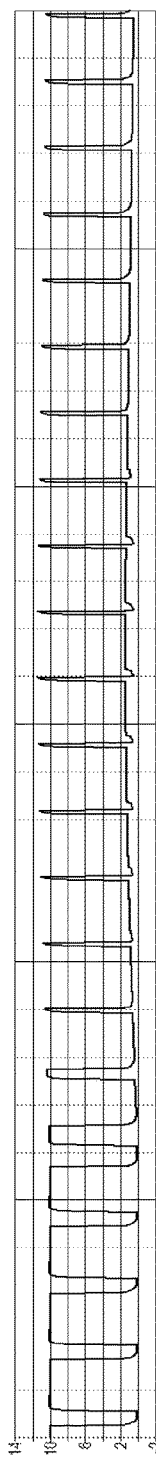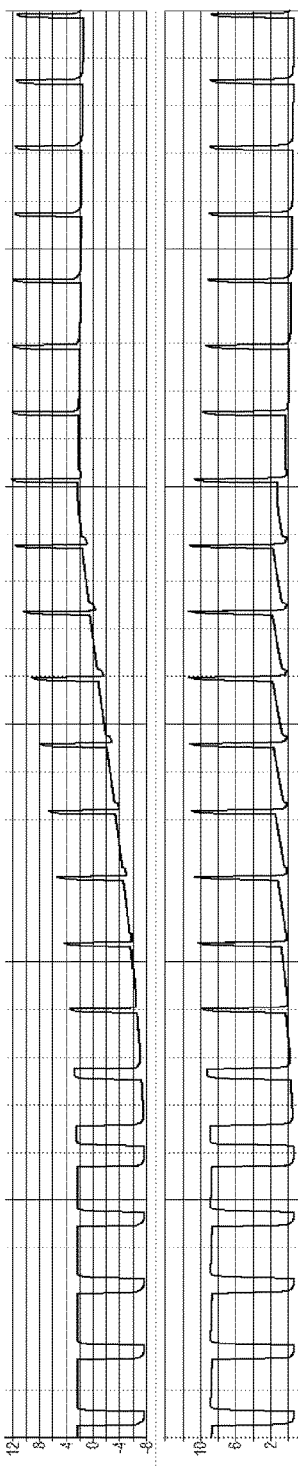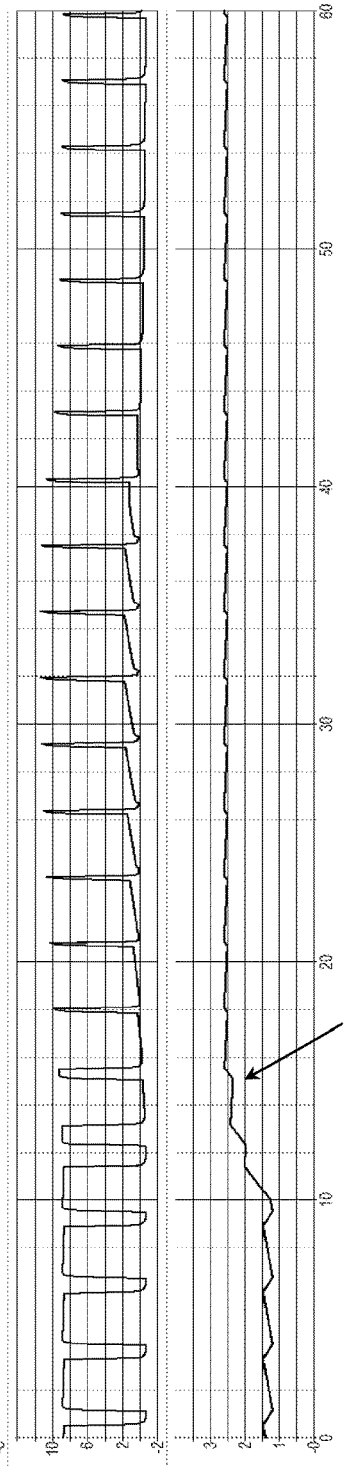
FIG. 11A $V_{PWM\_OUT}$
FIG. 11B $V_{C1}$ & $V_{C2}$
FIG. 11C $V_{P1}$
FIG. 11D $V_{GS}$
FIG. 11E $I_{L1}$ — Inductor current is controlled and never saturates.

US 9,966,837 B1

POWER CONVERTER WITH CIRCUITS FOR PROVIDING GATE DRIVING

CROSS-REFERENCE TO RELATED APPLICATIONS

The present application claims priority to and the benefit of the filing date of U.S. Provisional Application No. 62/360,315 filed Jul. 8, 2016, the entire disclosure of which is hereby incorporated herein by reference.

BACKGROUND

Technical Field

This invention relates generally to the field of pulse-width modulated switched-mode power supplies and more particularly circuitry which drives the switch, currently classified in CPC H03K 17/691.

Review of Related Art

The General Problem:

The invention is directed to solving problems that arise when pulse-width-modulator (PWM) type switched-mode power supplies (SMPSs) encounter fault conditions such as a short circuit across their output. One problem that arises with isolated switch drivers during an overload or short circuit event is that the power supply does not turn off the output current when it is commanded to do so. This problem can be solved by providing a better isolated driver for the power switch.

Modern electronics which require DC power almost always use SMPSs. These convert unregulated DC power with various input voltages, $V_{IN}$, into regulated output power, $V_{OUT}$. Although more complicated than linear regulators, SMPSs can be far more efficient and have been ubiquitous for at least forty years. These are generally classified based on a topology, e.g., buck, boost, fly-back, etc., based on the arrangement of power switches, rectifying diodes, and magnetic components—inductors or transformers.

These can be separated into two main classes: those where the power switch is referenced to the same ground as the PWM and those that require separate grounds. In some topologies, such as the buck topology, the power switch is referenced to $V_{IN}$ when the switch is turned on. If $V_{IN}$ is low enough the PWM can still drive the switch. At higher $V_{IN}$, what is known as a "high side gate driver" is typically required. In that case, one simple technique, discussed below, is to connect a small signal pulse transformer between the PWM and switch. Another technique is to provide a floating DC supply to power a gate driver which is driven by the PWM via a signal transformer or an opto-isolator. These other approaches have advantages and disadvantages, but they are not the subject of this invention, except for one disadvantage. Some approaches use a fair number of parts. In general, parts count should be minimized, not just from a cost standpoint, but from the standpoint of reliability. More parts mean a higher failure rate for the SMPS. This is especially important for military and space-borne applications; the latter requiring radiation-hardened components. In such cases, passive components are more reliable than transistors which are more reliable than integrated circuits.

Note: In this application, all Rn, Ln, Cn, TXn, Dn, Qn, and Xn used as designators in the drawings are resistors, inductors, capacitors, transformers ($V_{Pn}$ and $V_{Sn}$ are the primaries and secondaries), diodes, transistors, and modules, respectively. Values are indicated by the component designator unbolded, e.g., R1 is the value of resistor R1 in ohms. Unless otherwise shown, currents through or voltages across components are indicated by, e.g., $I_{R1}$ or $V_{R1}$ which is the current through R1 or the voltage across it, or, e.g., $V_{GS}$ as the voltage from the gate-to-source of a MOSFET. Where important, polarities are shown with a + and a −. To aid understanding, devices are sometimes characterized as small signal or power. There is no sharp divide, but small signal devices are designed to pass milliamps while power devices pass amps.

Transformer Coupled Gate Driver

FIG. 1 illustrates a generic transformer coupled high-side gate driver. This is shown in conjunction with a basic buck topology regulator used when $V_{OUT} < V_{IN}$. An input is produced by a pulse width modulator, PWM, which is connected through a generic four-port module X1 and DC blocking capacitor C1 to the high side of isolation transformer TX0. (Even a small net DC voltage can cause excessive currents in TX0, so a DC-blocking capacitor is used.) $R_{DRV}$ is the equivalent internal output resistance of the PWM, which is powered by voltage, $V_{CC}$. It produces unipolar pulses, $V_{PWM\_OUT}$, of magnitude, V (less any drop across $R_{DRV}$), for a $T_{ON}$ time and 0 for a $T_{OFF}$ time having a duty cycle, $D = T_{ON}/(T_{ON} + T_{OFF})$. (Herein, ON or OFF refers to the PWM or the power MOSFET switch.) The PWM controls $V_{OUT}$ by varying the duty cycle, D. Maximum D for PWMs is set by external RC timing components and can approach 1.0. For a loss-less buck converter in steady state, $V_{OUT} = DV_{IN}$. Diode D1 across capacitor C1 is sometimes used.

$L_M$ represents the magnetizing inductance of transformer TX0 whose importance is discussed below. $V_{P0}$ is the voltage on the primary side and $V_{S0}$ is the secondary voltage with the polarity indicated by the dots, as usual. A 1:1 turns ratio is preferred because a bifilar winding can be used which reduces the leakage inductance that slows down pulse rise and fall times and can cause oscillations. The secondary $V_{S0}$ is connected through a conceptual module X2 to the gate and source of power MOSFET switch Q1 indicated by $V_{GS}$ across $C_{ISS}$ which is the internal equivalent input capacitance of Q1.

The power output section is fed by an input buss, $V_{IN}$, which may be well or poorly regulated, which is connected to the drain of Q1. The source of Q1 is connected to power inductor L1 and the cathode of free-wheeling diode $D_{OUT}$ whose anode is connected to ground. (Because of the isolation transformer TX0, it need not be the same as the ground on the primary side.) The output of inductor L1 is connected to an output energy storage capacitor $C_{OUT}$ and a real load represented by $R_{LOAD}$. The output voltage, $V_{OUT}$, is fed back to the PWM which regulates it by varying the duty cycle. Usually this is indirect in that there is an inner current feedback loop which senses and controls the current, $I_{Q1}$, in MOSFET Q1, whose set point is controlled by the outer voltage control loop. The current loop can also limit $I_{Q1}$ in an overload condition.

MOSFET Switches:

Currently, as shown, the switch of choice is an N-channel enhancement mode MOSFET designed to handle high power. It is a three terminal device having a gate, a drain, and a source, with a conductive channel between the drain and source whose resistance, $R_{DS}$, is controlled by the gate-to-source voltage, $V_{GS}$. Resistance $R_{DS}$ is large until $V_{GS}$ exceeds some threshold $V_{TH}$ which is typically 2 to 4 volts. Above this, $R_{DS}$ decreases until when the device is fully enhanced above 7 volts for standard power MOSFETs, $R_{DS}$ reaches a minimum, $R_{DSON}$. For power MOSFETS with drain-to-source breakdown voltages less than 100 volts, $R_{DSON}$ can be in the low milliohm range. So-called, logic level MOSFETS are also available. These are fully on when $V_{GS}$ exceeds 4 to 4.5 volts and have a correspondingly lower $V_{TH}$.

MOSFETs have specified limitations. Relevant here is the maximum $V_{GS}$ which is, typically, ±20 volts. However, operating the MOSFETs with $V_{GS}$ between 7V and 15V is common practice since $R_{DS}$ is essentially the same over this range and repetitive operation above 15 volts may exceed the derating requirement for the design. $V_{GS}$<0 volts is not needed to turn the MOSFET off.

The function of the gate driver is to charge $C_{ISS}$ to a $V_{GS}$ sufficient to turn the MOSFET on. $C_{ISS}$ is a combination of $C_{GS}$ and $C_{GD}$ and is non-linear, but data sheets usually give typical total gate charge, $Q_{GT}$, to produce a certain $V_{GS}$. From this, $<C_{ISS}>=Q_{GT}/V_{GS}$ can be used as an equivalent lumped capacitance. Typically, $<C_{ISS}>$ ranges from 1 to 10 nF, increasing with increasing current handling capability.

Transformer Isolation Circuit Problems:

At low duty cycles, a workable gate driver can be made by directly connecting the secondary of TX0 across the gate-to-source of Q1. Early prior art identifies and solves various problems with this approach.

For instance, U.S. Pat. No. 4,748,351 to Barzegar on May 31, 1988, incorporated herein by reference, has, as on object of the invention, to make sure the power switch (a MOSFET) does not turn on due to spurious inputs which could destroy it. From his FIG. 1, in place of X1 in FIG. 1 here, he uses a dual one shot multi-vibrator to generate a positive pulse on the leading edge and a negative pulse on the trailing edge of a pulse from the PWM. In place of X2 here, he uses a diode to positively charge the gate capacitance of the MOSFET. Also, via a second secondary winding, the negative pulse turns on a control MOSFET which pulls the gate of the power MOSFET to zero, turning it off, and keeps it there until the next positive pulse.

Based on the illustrated waveforms, Barzegar did not contemplate that modern PWMs typically need to operate with very short pulse widths (as will be illustrated in what follows). Thus, his negative pulse may overlap with the positive pulse, and the MOSFET not get turned on. The same could be true at large duty cycles, but simple transformer isolation does not work well (as explained below) at duty cycles much over 50%.

To operate at high duty cycles, U.S. Pat. No. 5,168,182, to Salerno et al. on Dec. 1, 1992, entitled, "0-100% Duty Cycle, Transformer Isolated FET Driver," uses a high frequency clock and a dual flip-flop to create a 50% pulse train which is modulated on/off by the PWM in place of X1 in FIG. 1 here. X2 is a half wave rectifier off a center tap secondary that demodulates the pulse train to turn a MOSFET on. This appears to work except it uses a resistor from gate to source to turn the MOSFET off which will dissipate power during the time the MOSFET is on. Raising its value would reduce power consumption, but slow down MOSFET turn-off leading to switching loses. Also, they use a PMW frequency of 5 kHz and clock frequency of 100 kHz. This means the duty cycle makes 5% jumps which would probably cause limit cycling and increase output voltage ripple, especially at low duty cycles. Also, modern PWMs operate at well over 100 kHz and provide less than 1% ripple so scaling would require well over a 10 MHz clock.

Two More Problems:

First, when the PWM is ON, without the DC-restoration described below, initially, $V_{GS}$ at Q1=$V_{S0}$=$V_{P0}$=V (e.g., 0 or 10 volts). After the PWM operates at a constant duty cycle, D, capacitor C1 charges up to $V_{C1}$=DV Then, $V_{GS}$=$V_{S0}$=$V_{P0}$=V-$V_{C1}$=(1-D)V. At high duty cycles, $V_{GS}$ may not be enough to turn Q1 on. This can be ameliorated by increasing the turns ratio on TX0. For example, 1:2 would limit $V_{S0}$ to 20 volts on start-up, but provide 5 volts when D=0.75, enough to turn on a logic level MOSFET. However, the maximum $V_{GS}$ for GaN FETs is 6 volts, so one would need a 1:0.6 ratio which limits D to 0.16 if one is to obtain the desired 5 volt $V_{GS}$ to turn them on.

There is another well-known problem if the PWM, after operating in a quasi-steady state with a duty cycle, D, shuts down (V=0) attempting to turn off Q1. Capacitor C1, which has charged up to DV, discharges through the transformer magnetizing inductance LM. Whatever impedance is connected to the secondary of TX0 is in parallel with LM but this is large enough to be neglected. Thus, including $R_{DRV}$, one has an RLC circuit. Since $R_{DRV}$ is small (on purpose), it is under-damped. The discharge of C1 and the problems it creates, which occur before any damping is significant, can be treated as an undamped oscillation for which $V_{C1}$=DV× cos(ωt) (t=0 when shutdown occurs.)

Following this through the circuit with the secondary of TX0 directly connected to Q1, when V=0, $V_{GS}$=$V_{S0}$=$V_{P0}$=-$V_{C1}$=-DV×cos(ωt). $V_{GS}$(t=0) may not be a problem, but the real problem occurs when ωt=180 degrees where cos(ωt)=-1. Then, $V_{GS}$=DV. If the prior steady state duty cycle, D, is above 0.4, and V=10 so that DV=4, MOSFET Q1 would turn ON when it should be OFF.

First Prior Art Partial Solution:

U.S. Pat. No. 8,860,471, issued to Xu et al. on Oct. 14, 2014, incorporated herein by reference, recognized both problems disclosing circuitry similar to FIG. 1 here. Diode D1 is used to limit $V_{C1}$ to positive values. This limits $V_{S0}$=$V_{P0}$ to negative values when V=0 and MOSFET Q1 is not turned on at the wrong time. For X2, they use a variety of diodes and transistors, principally, charging the gate of Q1 via a diode and discharging via PNP transistors.

They also recognized that, for normal operation, the transformer turns ratio may have to be increased to turn on the MOSFET at high duty cycles creating an over voltage during startup before C1 charges up. To solve this problem, they insert an active Zener voltage clamp across the transformer secondary which is directly connected to the MOSFET, see their FIG. 2. Other circuitry discharges the MOSFET input capacitance for faster turn-off. They impliedly recognize that their Zener clamp acts like a short circuit above the clamping voltage and their FIG. 6 shows an additional current limiting resistor R1 in series with the PWM output even though it may slow down MOSFET turn on, see col. 8, ll. 25-29, which may increase switching losses too much to be desirable.

Traditional DC-Restore Circuit:

One, almost traditional, approach (dating back to early television) to high side gate drivers is to use a simple DC-restore circuit whose basic components are illustrated in FIG. 2. This is the generic transformer isolated driver illustrated in FIG. 1 with X1 being a direct connection and X2 consisting of four components connected to the secondary of TX0. The high side is connected through a DC-restore capacitor C2 and through a current limiting resistor R1 to the gate of power MOSFET Q1. DC-restore diode D2 and $C_{ISS}$ bleed-off resistor R2 are connected in parallel across the gate and source of Q1.

The power output section in FIG. 2, which is a standard generic buck converter, operates as follows: (Wave forms are shown in FIG. 3, but these will be discussed later in conjunction with shutdown problems.) When Q1 switches ON, current flows from $V_{IN}$ through Q1 and L1 into $C_{OUT}$ and $R_{LOAD}$. Assuming ideal components, with Q1 ON, current through L1, $I_{L1}$, increases at a rate of $(V_{IN}-V_{OUT})/L1$ amps per second for $T_{ON}=DT$ seconds for an increase in $I_{L1}=(V_{IN}-V_{OUT})DT/L1$ amps. When Q1 switches off, current continues to circulate through L1 via diode Dour but decreases at a rate of $V_{OUT}/L1$ amps per second for a time $T_{OFF}=(1-D)T$ seconds for a decrease in $I_{L1}=V_{OUT}(1-D)T/L1$ amps. In quasi-steady state, the increase in $I_{L1}$=the decrease, hence $DV_{IN}=V_{OUT}$ or $D=V_{OUT}/V_{IN}$ as noted above. This is the well know equation for a buck topology which will be important below. (The equations for other topologies and discontinuous current mode are more complicated, but not needed here.)

Two things follow. First, specifying $V_{OUT}/V_{IN}$ sets the minimum required duty cycle, D. Second, if a short occurs on the output during $T_{ON}$, $I_{L1}$ increases at a rate of $V_{IN}/L1$ amps per second which can be much faster than $(V_{IN}-V_{OUT})/L1$ and can lead to over currents if the feedback control and MOSFET gate driver circuits are not designed properly to handle overload conditions.

The switching frequency $F=1/(T_{ON}+T_{OFF})$. Generally, higher switching frequencies are preferred because they reduce inductor size, but, at some point, increasing switching losses in the MOSFET start to outweigh the incremental benefits of further reducing the inductor size.

In a quasi-steady state, the PWM adjusts D to obtain the desired $V_{OUT}$. However, when the current, $I_{Q1}$, is beyond a certain limit, $I_{CL}$, the current control loop takes over complete control and keeps the current at or near the limit. When the overload on the output ends, $C_{OUT}$ will start charging up again until the voltage loop re-closes and the PWM regulates $V_{OUT}$. If the overload continues indefinitely, the aim is to limit the current through Q1 to avoid damaging it.

Referring back to FIG. 2, "[The] dc-restorer circuit has been suggested for many years for circuits that require an isolated drive in excess of 50% duty cycle. This circuit can very often lead to failure when the power supply is turned off, and is not recommended," Gate Drive Design Tips, FIG. 6 caption, Dr. Ray Ridley, available at http://ridleyengineering.com/design-center-ridley-engineering/49-circuit-designs/45-3-gate-drive-design-tips.html. In spite of the recommendation, this circuit has important advantages.

First, by itself, it can operate at duty cycles approaching 100% (limited only by the PWM. With DC-restore capacitor C2 and diode D2 in the circuit, in normal operation, $V_{SO}=V_{PO}$ goes from $-DV$ to $(1-D)V$. When $V_{SO}$ goes negative, diode D2 conducts and charge is transferred from capacitor C1 to capacitor C2 which charges up to $+DV$ (minus a diode drop across D2), provided C1>>C2. When $V_{SO}$ goes positive, $V_{GS}=V_{SO}+V_{C2}=(1-D)V+DV=V$, completely independent of duty cycle. Thus, it is not necessary to increase the transformer turns ratio to operate at higher duty cycles.

Second, since pulse transformers and ceramic capacitors are inherently fast, with no intervening active devices, turn-on and turn-off of MOSFET Q1 is only limited by the PWM and R1. This minimizes switching loses especially during output short circuits. During charge and discharge of $C_{ISS}$, the time constant is determined by $R_{DRV}$ and R1 in series with C1, C2, and $C_{ISS}$. If $C_{ISS}$<<C1 and C2, the series equivalent≈$C_{ISS}$ and the time constant can be quite small.

Resistor R1 provides some high-frequency damping for the parasitic LC circuit that is formed by $C_{ISS}$ and the gate driver transformer leakage inductance but is generally small, e.g., 10 ohms. Bleed off resistor R2 is used to prevent $C_{ISS}$ from charging up due to drain-to-gate leakage currents and turning on MOSFET Q1 prior to the PWM start-up. Since it is also part of the voltage divider with capacitor C2, it should not be too small, i.e., R2*C2>> longest $T_{ON}$.

Shutdown Problems Simulated:

Even using the DC-restore circuit with the diode D1 across capacitor C1, there still remains a problem. Recall that after shutdown, $V_{SO}=-V_{C1}=-DV\times\cos(\omega t)$. Now, $V_{GS}=V_{SO}+V_{C2}=-DV\times\cos(\omega t)+DV=DV\times(1-\cos(\omega t))$. The diode D1 only keeps $V_{C1}$ from going negative for $\omega t>90$ degrees, but before that, $DV\times(1-\cos(\omega t))>V_{TH}$ for some combination of D and $\omega t$, turning MOSFET Q1 ON.

FIGS. 3A-3F show various waveforms (the time base in all figures is 10 μsec per major division except where noted) which illustrate the foregoing discussion for a traditional DC-restore circuit as illustrated in FIG. 2 with diode D1 used. These were generated using a software program similar to the well-known SPICE software. (Simulation details are given in the Detailed Description which follows.) The simulation is of a typical scenario in which the load is shorted to ground and the PWM attempts to recover. In these figures, the vertical axes are in volts, except FIGS. 3E & 3F are in amps.

FIG. 3A shows the output of the PWM, $VP_{PWM\_OUT}$ (=V in the discussion above) running at a frequency of 360 kHz (T=2.8 μsec). A short occurs at t=10 μsec. Before that, the PWM is running at D=about 0.8 to provide $V_{OUT}$=6.1 volts for $V_{IN}$=8 volts. (It is higher than an ideal 0.76, primarily due to losses in MOSFET Q1.) During $T_{ON}$, V=10 volts and during $T_{OFF}$, V=0.

FIG. 3B shows $V_{C1}$ charged to DV=8 volts. During $T_{OFF}$, $V_{C2}$ is recharged via D2 to $V_{C1}$ minus a diode drop. During $T_{ON}$, C2 discharges slightly to charge $C_{ISS}$. FIG. 3C shows the voltage on the primary, $V_{PO}=V-V_{C1}=V-DV$ swinging from −8 to +2 volts, which is also the voltage on the secondary, $V_{SO}$. FIG. 3D shows $V_{GS}=V_{SO}+V_{C2}$ swinging from about −0.6 to about 8.5 volts. FIG. 3E shows $I_{L1}$, the current through the inductor L1, having a DC value of about 1.3 amps and increasing during $T_{ON}$ and decreasing during $T_{OFF}$. FIG. 3F shows the current when Q1 is ON, $I_{Q1}$. This is the current that charges inductor L1 which stores magnetic energy and charges capacitor $C_{OUT}$ when Q1 turns OFF.

At t=10 μsec, a short is applied to the load. Since $V_{OUT}=0$, as seen in FIG. 3F, $I_{Q1}$ increases more rapidly because the full $V_{IN}$ is applied to the inductor L1. The very next switch cycle following the output short, the PWM starts to terminate the output pulse earlier than normal due to $I_{Q1}$ rising to the PWM current limit). The cycle repeats but, since $I_{L1}$ increased, the $I_{Q1}$ current limit is reached earlier and the PWM produces an output pulse that is shorter in duration than the preceding one. After a few cycles, the duty cycle has decreased significantly enough to where $I_{L1}$ peaks at about 2.5 amps at the trailing edge of every PWM ON pulse.

Meanwhile, since D is falling from 0.8 to roughly 0.06, as FIG. 3B shows, the equilibrium voltage, $V_{C1}$, on C1 is falling from 8 volts to a new equilibrium of 0.6 volts. During OFF pulses, C2 is recharged by C1 until $V_{C1}$ falls below $V_{C2}$ minus a diode drop, then $V_{C2}$ starts decaying slowly. As shown in FIG. 3C, during OFF periods, $V_{PO}=V_{SO}=-V_{C1}$ is rising as is $V_{GS}$ in FIG. 3D. At t=26 μsec, $V_{GS}>V_{TH}$=about 3 volts, and Q1 turns ON and stays on even though the PWM output is low (OFF). FIG. 3E shows $I_{L1}$ increasing at a rate of $V_{IN}/L1$ amps per second until, at t=30 μsec, when, as indicated by the arrow, L1 saturates (L1 becomes very small) and $I_{Q1}$ gets out of control which would result in the destruction of the particular MOSFET Q1 used in the simulation.

Second Prior Art Partial Solution:

U.S. Pat. No. 6,807,071, issued to Zhang et al. on Oct. 19, 2004, incorporated herein by reference, recognized the problem with the traditional DC restore circuit that, even when the PWM shuts down, the MOSFET can mis-trigger causing breakdowns. FIG. 4 illustrates an adaption of their FIG. 6 to FIG. 2 here. (N B Zhang et al. do not show a damping resistor like R1 nor a bleed-off resistor R2.) To the traditional DC-restore circuit, an N-channel MOSFET Q0 has been added with the gate-to-source directly across the secondary of TX0 and the drain of Q0 making the connection to the source of Q1 and attached components. $D_{BODY}$ is the internal body diode of Q0. They suggest that one might rely on saturation of the isolation transformer instead of adding a diode across C1, but provide no details. Since the transformer core saturation properties vary widely over temperature, a design that saturates at low temperatures to prevent mis-triggering could saturate too soon at higher temperatures and prevent turning on Q1 when it should be. Therefore, Zhang et al.'s alternative of a diode D1 across C1 has been adopted.

In operation, if the gate-to-source voltage of Q0, $V_{GS0}$, is greater than its $V_{TH}$, Q0 turns on. With Q0 on, $V_{GS}=V_{S0}+V_{C2}$ as before. When Q0 is off, the internal body diode of Q0, which has its cathode connected to the drain and its anode connected to the source, will still conduct current from the low side of TX0 to the source of MOSFET Q1.

In normal quasi-steady state operation, assuming $V_{C1}=DV$ as usual, when $V_{PWM\_OUT}=0$, $V_{S0}=-DV$. So $V_{C2}$ charges up via the body diode in Q0 and diode D2 to +DV minus, in this case, two diode drops. When $V_{PWM\_OUT}=V$, then $V_{GS}=V_{S0}+V_{C2}=V-DV+O10$ nominally DV as usual, =V, provided, however, $V_{S0}>V_{TH}$ of the MOSFET Q0. But $V_{S0}=(1-D)V$. This presents a problem at high duty cycles similar to the problem above of providing a high enough $V_{GS}$ to turn on Q1 without using the DC-restore technique. If Q0 is a logic level MOSFET, the minimum $V_{GS}$ of Q0 to guarantee it is fully on would be approximately 4 volts. Thus D<0.6 is required. This is not as severe as having to turn on Q1 with 7 volts, where D<0.3 was required without the DC-restore circuitry, but it is still a drawback.

After a PWM shutdown ($V_{PWM\_OUT}=0$) as Zhang et al, contemplated, $V_{GS0}=V_{S0}=-DV$ and because of diode D1, $V_{GS0}$ can never rise above 0.6 volts, so Q0 does not turn on and, therefore, Q1 does not turn on because the circuit through Q0 is not completed. At the beginning of the shutdown, $V_{GS1}=0$, i.e., $C_{ISS}$ is completely discharged and, with Q0 off, can never be charged. A simulation, with an external shutdown of the PWM, showed the circuit worked as intended with a result very similar to their FIG. 7 and is not shown.

Zhang et al. looked at shutdown problems when their (in their FIG. 6) and our blocking capacitor C1 discharges. More generally, whenever the PWM abruptly changes duty cycle from Di to Df, $V_{C1}$ oscillates with the following envelope, $V_{C1}(t)=V\times[Di\cos(\omega t)+Df(1-\cos(\omega t)]=V\times[Df+(Di-Df)\cos(\omega t)]$. At one extreme, if Df≈Di, there is no problem. At the other extreme, if Df=0, the amplitude, (Di-Df), is the greatest, but Zhang et al. solved that problem. So, if there is no problem at the extremes, conceptually there should be no problem for 0<Df<Di. Thus, looking at the schematic, the addition of MOSFET Q0 with diode D1 appeared to provide an ideal solution, at least for moderate duty cycles, (D<0.6) because it only added two components. However, when a simulation of a short circuit on the output was tried where the duty cycle was suddenly reduced from a moderate level (Di=0.5) to a very low level (Df=0.06), an unexpected result was obtained as shown in FIGS. 5A-5E. This is similar to FIGS. 3A-3E discussed previously.

For t<10 μsec, FIG. 5A shows $V_{PWN\_OUT}$ toggling between V=0 and V=10 volts. Because of the limitation on high duty cycles, $V_{OUT}$ was set to 0.5×$V_{IN}$, so that in quasi-steady state, D=0.5 about. The PWM maximum duty cycle was constrained to D=0.63. FIG. 5B shows $V_{C1}=DV=5$ volts. During OFF pulses, $V_{C2}$ is recharged to $V_{C1}$ minus two diode drops=about 4 volts. During ON pulses, $V_{C2}$ drops after transferring charge to $C_{ISS}$. In FIG. 5C, $V_{P0}=V_{S0}=V-V_{C1}$ and toggles from -5 to +5 volts. If the duty cycle, D, had been higher, say D=0.8, then $V_{SO}$ would toggle from -8 to +2 volts which would not have been enough to turn Q0 on to allow $V_{SO}$ through to turn Q1 on. As it is, +5 volts is sufficient for a small signal MOSFET Q0 and $V_{GS}$ is restored and toggles between 0 and 8 volts. FIG. 5E shows $I_{L1}$ ramping up and down on top of a DC component.

At t=10 μsec, a simulated short occurs on the output. As in FIG. 3E, as $I_{L1}$ increases in FIG. 5E, the PWM transitions to a constant current source mode with shorter and shorter ON pulses, see FIG. 5A.

FIG. 5B shows $V_{C1}$ decaying as part of a tank circuit, as before in FIG. 3B, and $V_{C2}$ decaying very slowly, also as before. FIG. 5C shows $V_{P0}=V_{S0}$ with a rising base as $V_{C1}$ decays. $V_{GS}$ in FIG. 5D was a surprise. One would expect the ON pulses to get through but, even though Q0 is off because $V_{S0}<V_{TH}$, even when $V_{S0}$ is negative, $V_{GS}$ has a rising base. This is unlike the rising base in FIG. 3B which mirrors the decay of $V_{C1}$.

Although it looks similar, the explanation is different. Each time the PWM is ON, $V_{GS}$ turns on Q1 by charging up $C_{ISS}$ to V, as it is supposed to. In the traditional DC-restore circuit, when the PWM is OFF, $C_{ISS}$ is discharged. With the addition of MOSFET Q0, capacitor $C_{ISS}$ still discharges through the body diode $D_{BODY}$ of Q0. However, this only continues while the diode is forward biased with about +0.6 volts. Referring back to FIG. 4, the forward voltage on the body diode is $V_B=-V_{S0}-V_{C2}+V_{GS}$. When the PWM is OFF, $V_{S0}=-V_{C1}$, so $V_B=V_{C1}-V_{C2}+V_{GS}$. $V_B=0.6$ when $V_{GS}=0.6+V_{C2}-V_{C1}$. Initially, $V_{C1}>V_{C2}$, so the body diode $D_{BODY}$ conducts until $V_{GS}=0$, i.e., $C_{ISS}$ is completely discharged. However, as $V_{C1}$ decays below $V_{C2}$, during $T_{OFF}$, $D_{BODY}$ stops conducting at the point where $V_{GS}$ is equal to the difference between $V_{C2}$ and $V_{C1}$. This results in higher and higher voltages across $V_{GS}$ during $T_{OFF}$ as $V_{C1}$ decays further below $V_{C2}$ with subsequent switching cycles. During $T_{OFF}$, the only bleed path for $C_{ISS}$ is through the bleed-off resistor R2 which has a very long time constant relative to the switch cycle. FIG. 5D shows the charging of $C_{ISS}$ during $T_{ON}$ and the slow discharge during Torn. Eventually, the charge builds up to the point (about 4 volts here) where $V_{GS}$ is sufficiently greater than $V_{TH}$ to cause a damaging magnitude of drain current, as indicated by the arrow at t=40 μsec where the inductor saturates.

Summarizing the results, if the PWM completely shuts down by suddenly stopping the PWM output stream of pulses, then $V_{GS}=0$ and Q1 does not turn on. However, if like most PWMs, it attempts to control the output short-circuit current by suddenly reducing the duty cycle to very low values, these very short ON pulses can be enough to charge up $C_{ISS}$ so the MOSFET Q1 stays on continuously for multiple switching cycles which causes MOSFET damage.

Passive Discharge of $C_{ISS}$:

Since Zhang et al. were only solving the problem of complete shut down (D=0), it appears that they did not look at the possibility of $C_{ISS}$ charging up. Possibly, as a result, they do not use the equivalent of R2 in FIG. 2. However, it is known in the art to use a resistor to passively discharge $C_{ISS}$. To see what effects this might have, several simulations were run under the same conditions that produced FIGS. 5A-5E.

Changing R2 from 4.99k to 1k dramatically reduced the peak current $I_{Q1}$ through Q1 from >10 amps to 3.6 amps. When R2=100 ohms, $I_{Q1}$ did not exceed the 2.5 amp PWM current limit. Substituting a logic level MOSFET for the standard MOSFET used previously, with R2=1k, $I_{Q1}$ peaked at 350 amps, lasting for about 100 psec. This is to be expected since the logic level MOSFET turns on with a lower $V_{GS}$. It also had a slightly higher $C_{ISS}$. However, R2=499 ohms reduced lot to a few 14 amp spikes. R2=100 ohms reduced $I_{Q1}$ to 2.5 amps.

Although this is a solution, it is not ideal. R2 dissipates power as $<V_{GS}^2>/R2=DV^2/R2$. At high duty cycles and low R2, this is undesirable. In particular, to illustrate with an extreme case, for very high power MOSFETS with a $C_{ISS}$ 10 times those used in the simulations, R2=10 ohms to achieve a flat $I_{Q1}$ peak would result in 5 watts dissipation for D=0.5 and V=10 volts. Admittedly, flat $I_{Q1}$ is not essential, but some trade-off calculations would be required using passive discharge. Also, the PWM may require a buffer to drive low values of R2. Less extreme cases would probably require simulations to find an optimum R2 value.

Other ways to ameliorate the output short-circuit problem are to use larger core, power inductors and larger die, higher maximum current MOSFETs. However, some SMPSs are use hybrid packaging and increased size is a drawback. While feasible for the low power supply used in the working examples, higher power supplies would run into MOSFET maximum current availability problems.

High Duty Cycle Capability Constraints:

Being constrained to operate at a relatively low duty cycle, D, is not always a problem. However, for a buck converter, $V_{OUT}<DV_{IN}$. Put another way, $V_{IN}>V_{OUT}/D$. If the duty cycle is low. $V_{IN}$ must be high which may not be available. It is also known that the product of the power stage (losses primarily in Q1, L1, and D4 in FIGS. 1 & 2) efficiency, η, and duty cycle, D, is equal to $V_{OUT}/V_{IN}$. If η<100%, then D must increase to make up for it. It is possible to calculate these losses a priori, but the safest course is to do a simulation. The reason for being conservative is that if the gate driver circuit cannot operate above or at least at the required duty cycle, D, the SMPS could latch off and either not start or cease operating after a load transient.

FIGS. 6A-6C (with 0.2 msec per major division) illustrate the concept of latch off on start up for the circuit illustrated in FIG. 4. A PWM programmed soft start was used which gradually increases the duty cycle, D. In this case, $V_{OUT}$=6.0 volts with a $V_{IN}$=8.1 volts, so quasi-steady state D=0.75. The maximum PWM duty cycle was set comfortably higher. FIG. 6B shows the voltage, $V_{SO}$ on the secondary of TX0. With a PWM output of about 10 volts, this swings from −10D to +10(1−D). As D increases, the positive excursion of $V_{SO}$ is gradually reduced until Q0 does not turn on and hence, as shown in FIG. 6A, $V_{GS}$ drops to below the threshold voltage (2.5 V) and Q1 does not turn on. FIG. 6C shows a steadily rising $V_{OUT}$ until this point, then it sags. The PWM responds by increasing D further, this ensuring latch off. FIGS. 7A-7C illustrate the same with an expanded time scale (10 psec per major division starting at 866 μsec) around the time of latch off. One can see more clearly how, at t=915 psec, D jumps to a maximum. This is why, in doing the simulations that produced FIG. 5, $V_{OUT}$ was set at $0.5 \times V_{IN}$ and the PWM was externally limited to $D_{MAX}$=0.63.

FIGS. 8A-8D (with 0.01 msec per major division starting at 1.19 msec) illustrate the response of the circuit in FIG. 4 to a sudden increase in load. In this case. $V_{OUT}$ was set to 5.0 volts so the PWM could use a soft start and settle at D=0.62. Before t=1.2 msec, the system is stable. At that point, as shown in FIG. 8D, $I_{LOAD}$ was increased from 0.5 to 1.5 amps. As shown in FIG. 8C, this caused $V_{OUT}$ to sag which, as shown in FIG. 8B, caused the PWM to increase D, but, as shown in FIG. 8A, after 1.22 msec, this was too much to turn on Q0 to turn on Q1 and it latched off.

Although Zhang et al. noted that DC-restore was needed to operate at "larger" duty cycles, see col. 1, ll. 32-38, they did not quantify D, nor address problems other than complete shutdown. Their Q1, Q0 in FIG. 4 here, is only specified as a "small power MOSFET," see col. 4, l. 7. Thus, they did not suggest looking for a MOSFET with a particularly low $V_{TH}$, which would help.

They only contemplate a 1:1 transformer, which is usually desirable, but if their Q1 were a logic level MOSFET, one could use 1:0.5 transformer which is better than a 1:1 from the standpoint of not charging $C_{ISS}$ as much.

What's Still Needed:

As discussed above, prior inventors have recognized several problems with gate drives using isolation transformers, in particular with the traditional DC-restore circuit, and advanced the state-of-the-art. However, applicant's simulations discovered remaining problems which, in some cases, can be quite serious. What's still needed to take advantage of the superior characteristics of a DC-restore circuit is an additional circuit that can compensate for abrupt reductions in duty cycle (usually in response to an output short circuit) so that short circuit currents remain below a conservative design limit allowing the use of power components sized for normal operation and in normal operation be able to operate from near zero to near 100% duty cycles even for power switches that are limited to gate drives less than six volts using minimal additional parts and not require the use of integrated circuits.

SUMMARY OF THE INVENTION

Aspects of the invention include Aspect 1, which is a switched mode power supply (SMPS) comprising: a pulse-width-modulator (PWM) with an output, a power section with a power switch (Q1) having a switch control that turns on said switch with a positive voltage at a positive input terminal with respect to a negative input terminal above a threshold voltage and turns said switch off with voltage below said threshold voltage, and a drive section for interfacing between said PWM and said switch; wherein said drive section has an input, an output, and an isolation transformer (TX1) disposed in between for isolating the drive section output from the input and having a primary winding (P1) input, a first secondary winding (S1a) output, and a second secondary winding (S1b) output wherein voltage from said secondary winding output is opposite in polarity to that of said first secondary winding (S1a) output; wherein said PWM outputs connect to said primary winding (P1) inputs through a DC-blocking capacitor (C1); wherein said first secondary winding (S1a) is connected to said power switch control through a DC-restore capacitor (C2) connected to the positive input terminal (GATE) of said power switch as well as to the cathode of a DC-restore diode (D2) whose anode connects to a junction of the low side of said first secondary winding and the negative terminal of said switch input (SOURCE); and wherein the low side of said second secondary winding (S1b) connects to the low side of said first secondary winding (S1a) and the high side of said second secondary winding (S1b) connects to the control terminal of a DC-restore capacitor (C2) switch module (X3) having timing circuitry, said switch module (X3) having switch terminals disposed between the positive input terminal of said power switch (GATE) and the low side of said second secondary winding (S1b=S1a), wherein said timing circuitry turns off said DC-restore capacitor switch module (X3) after a preset time; whereby, after a voltage pulse is received from said second secondary winding (S1b), said DC-restore switch module connects said DC-restore capacitor (C2) to the low side of said first secondary winding (S1a), but only until the preset time has elapsed.

Aspect 2 is the SMPS of Aspect 1 wherein said DC-restore switch module (X3) comprises an NPN transistor (Q2) and said timing circuitry comprises a time constant capacitor (C3) connected to said second secondary winding high side and to a timing resistor (R3) which connects to the base of said transistor (Q2) whose collector is connected to the positive input terminal (GATE) of said power switch (Q1) and whose emitter is connected to the low side of said second secondary winding (S1b) further having the cathode of a diode (D3) connected to the junction of said time constant capacitor and said timing resistor and having its anode connected to the emitter of said NPN transistor (Q2).

Aspect 3 provides the SMPS of Aspect 2 wherein said NPN transistor is operated in the $3^{rd}$ quadrant and said DC-restore diode (D2) is removed from the circuit.

Aspect 4 is the SMPS of Aspect 1 wherein said DC-restore switch module (X3) comprises an N-channel MOSFET (Q2) and said timing circuitry comprises a time constant capacitor (C3) connected to said second secondary winding high side and to the gate of said MOSFET and a timing resistor (R3) connected between the gate of said MOSFET and the low side of said second secondary winding which connects to the source of said MOSFET whose drain connects to the positive input terminal of said power switch (GATE).

Aspect 5 is the SMPS of Aspect 4 wherein said DC-restore diode (D2) is removed from the circuit.

Aspect 6 is the SMPS of Aspects 4 or 5 wherein the cathode of a diode (D3) is connected to the junction of time constant capacitor (C3) and said timing resistor (R3) and whose anode is connected to the low side of said second secondary winding (S1b).

Aspect 7 is the SMPS of any of Aspects 1-6, further comprising: a diode (D1) connected across said DC-blocking capacitor (C1) with its cathode connected to said PWM output; and a second DC-restore switch connected across said DC-restore capacitor (C2) switch having a control terminal that turns said switch on after receiving a signal that said PWM has shut down.

Aspect 8 is the SMPS of any of Aspects 1-7 wherein said second DC-Restore switch comprises a PNP transistor (Q6) having its collector connected to the high side of said first secondary winding (S1a), its emitter connected to the cathode of said DC-restore diode (D2), and its base connected through a resistor (R17) to a disable switch (Q4) that connects said resistor to said PWM ground after PWM shuts down, or optionally immediately after or optionally concurrently when said PWM shuts down.

Aspect 9 is the SMPS of any of Aspects 1-8 wherein said second DC-restore switch comprises a P-channel MOSFET transistor (Q6) having its drain connected to the high side of said first secondary winding (S1a), its source connected to the cathode of said DC-restore diode (D2), and its gate connected through a resistor (R17) to a disable switch (Q4) that connects said resistor to said PWM ground after said PWM shuts down, or optionally immediately after or optionally concurrently when said PWM shuts down.

Aspect 10 is a switched mode power supply (SMPS) comprising: a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch off with voltage below said threshold voltage, and a drive section for interfacing between said PWM and said switch; wherein said drive section has an input, an output, and an isolation transformer (TX1) disposed in between for isolating the drive section output from the input and having a primary winding (P1) input and secondary winding (S1) output, wherein said PWM outputs connect to said primary winding (P1) inputs through a DC-blocking capacitor (C1); wherein said secondary winding (S1) is connected to said power switch control through a DC-restore capacitor (C2) connected to the positive input terminal (GATE) of said power switch (Q1) as well as to the cathode of a DC-restore diode (D2) whose anode connects to a junction of the low side of said first secondary winding (S1a) and the negative terminal (SOURCE) of said switch (Q1)E); a diode (D1) connected across said DC-blocking capacitor (C1) with its cathode oriented toward said PWM positive output; and a second DC-restore switch connected across said DC-restore capacitor (C2) having a control terminal that turns said switch on after receiving a signal that said PWM has shut down.

Aspect 11 is the SMPS of any of Aspects 1-10 wherein said second DC-restore switch comprises a PNP transistor (Q6) having its collector connected to the high side of said first secondary winding (S1a), its emitter connected to the cathode of said DC-restore diode (D2), and its base connected through a resistor (R17) to a disable switch (Q4) that connects said resistor to said PWM ground after said PWM shuts down, or optionally immediately after or optionally concurrently when said PWM shuts down.

Aspect 12 is the SMPS of any of Aspects 1-11 wherein said second DC-restore switch comprises a P-channel MOSFET transistor (Q6) having its drain connected to the high side of said first secondary winding (S1a), its source connected to the cathode of said DC-restore diode (D2), and its gate connected through a resistor (R17) to a disable switch (Q4) that connects said resistor to said PWM ground after said PWM shuts down, or optionally immediately after or optionally concurrently when said PWM shuts down.

Aspect 1A is a switched mode power supply (SMPS) comprising: a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns off said switch (Q1) with a voltage below said threshold voltage, and a drive section that provides an interface between said PWM and said switch; wherein said drive section has an input, an output, and an isolation transformer (TX1) disposed in between that isolates the drive section output from the input and having a primary winding ($V_{P1}$), a first secondary winding ($V_{S1a}$), and a second secondary winding ($V_{S1b}$) wherein voltage from said second secondary winding ($V_{S1b}$) is opposite in polarity to that of said first secondary winding ($V_{S1a}$) output; wherein said PWM outputs are connected to said primary winding ($V_{P1}$) through a DC-blocking capacitor (C1); wherein said first secondary winding ($V_{S1a}$) high side is connected to the positive input terminal (GATE) of said power switch (Q1) via a DC-restore capacitor (C2), said first secondary winding ($V_{S1a}$) low side is connected to the negative input terminal (SOURCE) of said switch (Q1) and, optionally, as well as to the anode of a DC-restore diode (D2) with its cathode connected to said DC-restore capacitor (C2) opposite the capacitor's connection to said first secondary winding ($V_{S1a}$) high side; and wherein said second secondary winding ($V_{S1b}$) high side is connected to a first control terminal of a DC-restore capacitor (C2) switch module (X3) and said second secondary winding ($V_{S1b}$) low side is connected to a second control terminal of said switch module (X3) and to said first secondary winding ($V_{S1a}$) low side, wherein said switch module (X3) has a switch connected across said DC-restore capacitor (C2), opposite the capacitor's connection to said first secondary winding ($V_{S1a}$) high side, and said first secondary winding ($V_{S1a}$) low side, wherein said switch module (X3) has timing circuitry which turns off said DC-restore capacitor switch module (X3) after a preset time; whereby, during use, after a voltage pulse is received from said second secondary winding ($V_{S1b}$), said DC-restore capacitor switch module (X3) connects said DC-restore capacitor (C2) to said first secondary winding ($V_{S1a}$) low side, but only until the preset time has elapsed.

Aspect 2A is the SMPS of Aspect 1A further including a diode (D1) connected in parallel with said DC-blocking capacitor (C1) with its cathode oriented toward said positive output of said PWM.

Aspect 3A is the SMPS of Aspect 1A wherein said DC-restore capacitor switch module (X3) comprises an NPN transistor (Q2) and said timing circuitry comprises a timing capacitor (C3) connected to said second secondary winding ($V_{S1b}$) high side and to a timing resistor (R3) connected to said transistor (Q2) base whose collector is connected to said DC-restore capacitor (C2) opposite the capacitor's connection to said first secondary winding ($V_{S1a}$) high side and whose emitter is connected to both of said secondary winding ($V_{S1a}$, $V_{S1b}$) low sides, further having the cathode of a diode (D3) connected to the junction of said time constant capacitor (C3) and said timing resistor (R3) and having its anode connected to the emitter of said NPN transistor (Q2).

Aspect 4A is the SMPS of Aspect 3A further including a diode (D1) connected in parallel with said DC-blocking capacitor (C1) with its cathode oriented toward said positive output of said PWM.

Aspect 5A is the SMPS of Aspect 3A further including a DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side.

Aspect 6A is the SMPS of Aspect 1A wherein said DC-restore switch module (X3) comprises an N-channel MOSFET (Q2) and said timing circuitry comprises a timing capacitor (C3) connected to said second secondary winding ($V_{S1b}$) high side and to the gate of said MOSFET (Q2) and a timing resistor (R3) connected between the gate of said MOSFET (Q2) and said second secondary winding ($V_{S1b}$) low side which is connected to the source of said MOSFET (Q2) whose drain is connected to said DC-restore capacitor (C2) opposite the capacitor's connection to said first secondary winding ($V_{S1a}$) high side.

Aspect 7A is the SMPS of Aspect 6A further including a diode (D1) connected in parallel with said DC-blocking capacitor (C1) with its cathode oriented toward the positive output of said PWM.

Aspect 8A is the SMPS of Aspect 6A further including a DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side.

Aspect 9A is the SMPS of Aspect 6A wherein the cathode of a diode (D3) is connected to the junction of said timing capacitor (C3) and said timing resistor (R3) and whose anode is connected to said second secondary winding (S1b) low side.

Aspect 10A is the SMPS of Aspect 1A, further including a diode (D1) connected across said DC-blocking capacitor (C1) with its cathode oriented toward said positive output of said PWM; further including a DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side; and a DC-restore capacitor shorting switch (SW2) connected across said DC-restore capacitor (C2) having control terminals that turn said switch on after receiving a signal that said PWM has shut down.

Aspect 11A is the SMPS of Aspect 10A wherein said DC-restore capacitor shorting switch (SW2) comprises a transistor (Q6), which is a PNP transistor having its collector connected to said DC-restore capacitor (C2) at its connection to said first secondary winding ($V_{S1a}$) high side, its emitter connected to said DC-restore capacitor (C2) at its connection to the cathode of said DC-restore diode (D2), and its base connected through a resistor (R17) to a disable switch (Q4) that connects said resistor (R17) to said PWM ground immediately after or concurrently when said PWM shuts down.

Aspect 12A is the SMPS of Aspect 10A wherein said second DC-restore switch comprises a transistor (Q6), which is a P-channel MOSFET transistor having its drain connected to said DC-restore capacitor (C2) at its connection to said first secondary winding ($V_{S1a}$) high side, its source connected to said DC-restore capacitor (C2) at its connection to the cathode of said DC-restore diode (D2), and its gate connected through a resistor (R17) to a disable switch (Q4) that connects said resistor (R17) to said PWM ground immediately after or concurrently when said PWM shuts down.

Aspect 13A is a switched mode power supply (SMPS) comprising: a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch; wherein said drive section has an input, an output, and an isolation transformer (TX1) disposed in between that isolates the drive section output from the input and having a primary winding ($V_{P1}$) and at least one secondary winding ($V_{S1a}$); wherein said PWM outputs are connected to said primary winding ($V_{P1}$) through a DC-blocking capacitor (C1); a diode (D1) connected across said DC-blocking capacitor (C1) with its cathode oriented toward said PWM positive output; wherein said at least one secondary winding ($V_{S1a}$) high side is connected to the positive input terminal (GATE) of said power switch (Q1) via a DC-restore capacitor (C2), said at least one secondary winding ($V_{S1a}$) low side is connected to the negative input terminal (SOURCE) of said switch (Q1) as well as to the anode of a DC-restore diode (D2) with its cathode connected to said DC-restore capacitor (C2) opposite the capacitor's connection to said first secondary winding ($V_{S1a}$) high side; and a DC-restore capacitor shorting switch (SW2) connected across said DC-restore capacitor (C2) having control terminals that turn said switch on after receiving a signal that said PWM has shut down.

Aspect 14A is the SMPS of Aspect 13A wherein said DC-restore capacitor shorting switch (SW2) comprises a transistor (Q6), which is a PNP transistor having its collector connected to said DC-restore capacitor (C2) at its connection to said first secondary winding ($V_{S1a}$) high side, its emitter connected said DC-restore capacitor (C2) at its connection to the cathode of said DC-restore diode (D2), and its base connected through a resistor (R17) to a disable switch (Q4) that connects said resistor to said PWM ground immediately after or concurrently when said PWM shuts down.

Aspect 15A is the SMPS of Aspect 13A wherein said second DC-restore switch comprises a P-channel MOSFET transistor (Q6) having its drain connected to said DC-restore capacitor (C2) at its connection to said first secondary winding ($V_{S1a}$) high side, its source connected said DC-restore capacitor (C2) at its connection to the cathode of said DC-restore diode (D2), and its gate connected through a resistor (R17) to a disable switch (Q4) that connects said resistor to said PWM ground immediately after or concurrently when said PWM shuts down.

Aspect 16A is a switched mode power supply (SMPS) comprising: a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch; wherein said drive section has an input, an output, and an isolation transformer (TX0) disposed in between that isolates the drive section output from the input and having a primary winding ($V_{P0}$) and a secondary winding ($V_{S0}$); wherein said PWM outputs are connected to said primary winding ($V_{P0}$) through a DC-blocking capacitor (C1); wherein said secondary winding ($V_{S0}$) high side is connected to the positive input terminal (GATE) of said power switch (Q1) via a DC-restore capacitor (C2), said secondary winding ($V_{S0}$) low side is connected to the negative input terminal (SOURCE) of said switch (Q1) and, optionally, as well to the anode of a DC-restore diode (D2) with its cathode connected to said DC-restore capacitor (C2) opposite the capacitor's connection to said secondary winding ($V_{S0}$) high side; and wherein said secondary winding ($V_{S0}$) is further connected to the control terminals of a DC-restore capacitor (C2) switch module (X4), wherein said switch module (X4) has a switch connected across said DC-restore capacitor (C2), opposite the capacitor's connection to said secondary winding ($V_{S0}$) high side, and said secondary winding ($V_{S0}$) low side, wherein said switch module (X4) has timing circuitry which turns off said DC-restore capacitor switch module (X4) after a preset time; whereby, during use, after a voltage pulse is received from said second secondary winding ($V_{S0}$), said DC-restore switch module connects said DC-restore capacitor (C2) to said secondary winding ($V_{S0}$) low side, but only until the preset time has elapsed.

Aspect 17A is the SMPS of Aspect 16A wherein said DC-restore capacitor switch module (X4) comprises a diode-pumped DC supply (D8, D9, C15) that powers a level translator (Q7) turned on and off by timing circuitry (C3, R3, D3) both fed by pulses from said secondary winding ($V_{S0}$), controlling in turn a DC-restore capacitor switch (Q2).

Aspect 18A is the SMPS of Aspect 16A wherein said DC-restore capacitor switch module (X4) comprises: a coupling capacitor (C14) connected to said secondary winding ($V_{S0}$) high side and the cathode of a diode (DS) connected to said secondary winding ($V_{S0}$) low side, the junction of the two being connected to the anode of a rectifying diode (D9) which is connected to a DC-supply capacitor (C15), which is also connected to said secondary winding ($V_{S0}$) low side, the cathode of said rectifying diode further connected to the cathode of a voltage limiting diode (D3) and the emitter of a PNP transistor; a timing capacitor (C3) connected to the anode of said rectifying diode (D9) and the anode of said voltage limiting diode (D3) and a timing resistor (R3) connected to the base of said PNP transistor; and a current limiting resistor (R19) connected to the collector of said PNP transistor, the other side connected to the base of an NPN transistor (Q2) and a turn-off resistor (R20) which is connected to said secondary winding ($V_{S0}$) low side and the emitter of said NPN transistor whose collector is connected to said DC-restore capacitor (C2) opposite the capacitor's connection to the secondary winding ($V_{S0}$) high side.

Aspect 19A is the SMPS of Aspect 16A further including a diode (D1) connected in parallel with said DC-blocking capacitor (C1) with its cathode oriented toward the positive output of said PWM.

Aspect 20A is the SMPS of Aspect 19A further including a DC-restore diode (D2) whose anode is connected to a junction of said secondary winding ($V_{S0}$) low side and the negative input terminal (SOURCE) of said switch (Q1) with its cathode connected to said DC-restore capacitor (C2) opposite the capacitor's connection to the high side of said secondary winding ($V_{S0}$).

Aspect 21A is a switched mode power supply (SMPS) comprising: a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch; wherein said drive section has an input, an output, and an isolation transformer (TX0, TX1) disposed in between that isolates the drive section output from the input and having a primary winding ($V_{P0}$, $V_{P1}$) and one or more secondary windings ($V_{S0}$, $V_{S1a}$, $V_{S1b}$); wherein said PWM outputs are connected to said primary winding ($V_{P0}$, $V_{P1}$) through a DC-blocking capacitor (C1); wherein one secondary winding ($V_{S0}$, $V_{S1a}$) high side is connected as a gate driver to the positive input terminal (GATE) of said power switch (Q1) via a DC-restore capacitor (C2), said secondary winding gate driver ($V_{S0}$, $V_{S1a}$) low side is connected to the negative input terminal (SOURCE) of said switch (Q1), and, optionally, as well to the anode of a DC-restore diode (D2) with its cathode connected to said DC-restore capacitor (C2), opposite the capacitor's connection to said secondary winding gate driver ($V_{S0}$, $V_{S1a}$) high side; and a DC-restore capacitor (C2) switch module (X3, X4) having a switch connected across said DC-restore capacitor (C2), opposite its connections to said secondary winding gate driver ($V_{S0}$, $V_{S1a}$) high side, and said secondary winding gate driver ($V_{S0}$, $V_{S1a}$) low side, wherein said switch module (X3, X4) is configured to accept inputs from one of said one or more secondary windings ($V_{S0}$, $V_{S1a}$, $V_{S1b}$) as a control winding to trigger timing circuitry that controls said DC-restore capacitor switch module (X3, X4) switch; whereby, during use, after a voltage pulse is received from said control winding ($V_{S0}$, $V_{S1a}$, $V_{S1b}$), said DC-restore switch module connects said DC-restore capacitor (C2) to said secondary winding gate driver ($V_{S0}$, $V_{S1a}$) low side, but only until a preset time has elapsed.

Aspect 22A is the SMPS of Aspect 21A wherein said gate driver and said control drive utilize the same winding.

Aspect 23A is the SMPS of Aspect 21A further including a diode (D1) connected in parallel with said DC-blocking capacitor (C1) with its cathode oriented toward the positive output of said PWM.

Aspect 24A is the SMPS of Aspect 21A further including a DC-restore diode (D2) with its anode connected to said secondary winding gate driver ($V_{S0}$, $V_{S1a}$) low side and its cathode connected to said DC-restore capacitor (C2) opposite the capacitor's connection to said secondary winding gate driver ($V_{S0}$, $V_{S1a}$) high side.

Among the preferred embodiments: preferably the SMPS uses a buck topology, but other topologies such as buck/boost, flyback, any of the various forward topology configurations, half-bridge, full-bridge, Cuk, SEPIC or Push-Pull could be used; preferably the power switch is a MOSFET, but a variety of other voltage controlled semiconductor switches including IGBTs, GaN FETs, or MCTs (MOS-Controlled Thyristor) could be used; preferably the isolation transformer is wound on a single core, but two separate cores could be used to form two independent transformers; preferably, the diodes are ordinary small signal diodes, but Schottky or any other rectifying device could be used; the DC-blocking capacitor on the input to the transformer primary could be moved to the low side and connect to the PWM ground, provided the diode across it is oriented with its anode at the PWM ground; and the DC-restore capacitor on the first secondary of the transformer could be moved to the low side, provided that other circuitry that was connected across it is moved accordingly.

BRIEF DESCRIPTION OF THE DRAWINGS

FIGS. 3A-F are waveforms showing the results of a simulated PWM transition from a high duty cycle to lower one using the gate driver circuitry in FIG. 2 wherein:

FIG. 3A shows the output of the PWM, $V_{PWM\_OUT}$;

FIG. 3B shows the voltage across capacitors C1 and C2, $V_{C1}$ and $V_{C2}$;

FIG. 3C shows the voltage on the primary of transformer TX0, $V_{P0}$;

FIG. 3D shows the gate-to-source voltage on MOSFET Q1, $V_{GS}$;

FIG. 3E shows the current through the output inductor L1, $I_{L1}$;

FIG. 3F shows the current through MOSFET Q1, $I_{Q1}$;

FIGS. 5A-E are waveforms showing the results of a simulated PWM transition from a moderate duty cycle to lower one using the gate driver circuitry in FIG. 4, wherein:

FIG. 5A shows the output of the PWM, $V_{PWM\_OUT}$;

FIG. 5B shows the voltage across capacitors C1 and C2, $V_{C1}$ and $V_{C2}$;

FIG. 5C shows the voltage on the primary of transformer TX0, $V_{P0}$;

FIG. 5D shows the gate-to-source voltage on MOSFET Q1, $V_{GS}$;

FIG. 5E shows the current through the output inductor L1, $I_{L1}$;

FIGS. 6A-C are waveforms showing the simulated results of a portion of power supply start up with the prior art gate driver improvement illustrated in FIG. 4, wherein:

FIG. 6A shows the gate-source voltage, $V_{GS}$, on MOSFET Q1;

FIG. 6B shows the output voltage, $V_{SO}$, on the secondary of transformer TX0;

FIG. 6C shows the power supply output voltage, $V_{OUT}$;

FIGS. 7A-C are waveforms showing an expanded portion of the simulated results of power supply start up shown in FIGS. 6A-C, wherein:

FIG. 7A shows the gate-source voltage, $V_{GS}$, on MOSFET Q1;

FIG. 7B shows the output voltage, $V_{SO}$, on the secondary of transformer TX0;

FIG. 7C shows the power supply output voltage, $V_{OUT}$;

FIGS. 8A-D are waveforms showing the simulated results of sudden load step with the prior art gate driver improvement illustrated in FIG. 4, wherein:

FIG. 8A shows the gate-source voltage, $V_{GS}$, on MOSFET Q1;

FIG. 8B shows the output voltage, $V_{SO}$, on the secondary of transformer TX0;

FIG. 8C shows the power supply output voltage, $V_{OUT}$;

FIG. 8D shows the output load current, $I_{LOAD}$;

FIG. 9 is a schematic of a generic improvement to the gate driver circuitry in FIG. 2;

FIG. 9A is a schematic of a first specific implementation to the gate driver circuitry in FIG. 9;

FIG. 9B is a schematic of a second specific implementation to the gate driver circuitry in FIG. 9;

FIGS. 10A-E are waveforms showing the results of a simulated PWM transition from a high duty cycle to a lower one using the gate driver circuitry in FIG. 9A, but without diode D1 across capacitor C1 removed from the circuit, wherein:

FIG. 10A shows the output of the PWM, $V_{PWM\_OUT}$;

FIG. 10B shows the voltage across capacitors C1 and C2. $V_{C1}$ and $V_{C2}$;

FIG. 10C shows the voltage on the primary of transformer TX1, $V_{P1}$;

FIG. 10D shows the gate-to-source voltage on MOSFET Q1, $V_{GS}$;

FIG. 10E shows the current through the output inductor L1, $I_{L1}$;

FIGS. 11A-E are waveforms showing the results of a simulated PWM transition from a high duty cycle to a lower one using the gate driver circuitry in FIG. 9A, but with diode D1 across capacitor C1 left in the circuit, wherein:

FIG. 11A shows the output of the PWM, $V_{PWM\_OUT}$;

FIG. 11B shows the voltage across capacitors C1 and C2, $V_{C1}$ and $V_{C2}$;

FIG. 11C shows the voltage on the primary of transformer TX1, $V_{P1}$;

FIG. 11D shows the gate-to-source voltage on MOSFET Q1, $V_{GS}$;

FIG. 11E shows the current through the output inductor L1, $I_{L1}$;

FIGS. 14A-E are waveforms showing the results of a simulated PWM transition from a high duty cycle to zero using the gate driver circuitry in FIG. 9B with the additional shut down circuitry in FIG. 13 which includes diode D1 across capacitor C1, wherein:

FIG. 14A shows the output of the PWM, $V_{PWM\_OUT}$;

FIG. 14B shows the voltage across capacitors C1 and C2, $V_{C1}$ and $V_{C2}$;

FIG. 14C shows the voltage on the primary of transformer TX1, $V_{P1}$;

FIG. 14D shows the gate-to-source voltage on MOSFET Q1, $V_{GS}$.

FIG. 14E shows the current through the output inductor L1, $I_{L1}$;

FIGS. 16A-E are waveforms showing the results of a simulated PWM transition from a high duty cycle to a lower one using the gate driver circuitry in FIG. 15, but with diode D1 across capacitor C1 removed from the circuit, wherein:

FIG. 16A shows the output of the PWM, $V_{PWM\_OUT}$;

FIG. 16B shows the voltage across capacitors C1 and C2, $V_{C1}$ and $V_{C2}$;

FIG. 16C shows the voltage on the primary of transformer TX0, $V_{P0}$;

FIG. 16D shows the gate-to-source voltage on MOSFET Q1, $V_{GS}$; and

FIG. 16E shows the current through the output inductor L1, $I_{L1}$.

DRAWINGS

Figure 17:
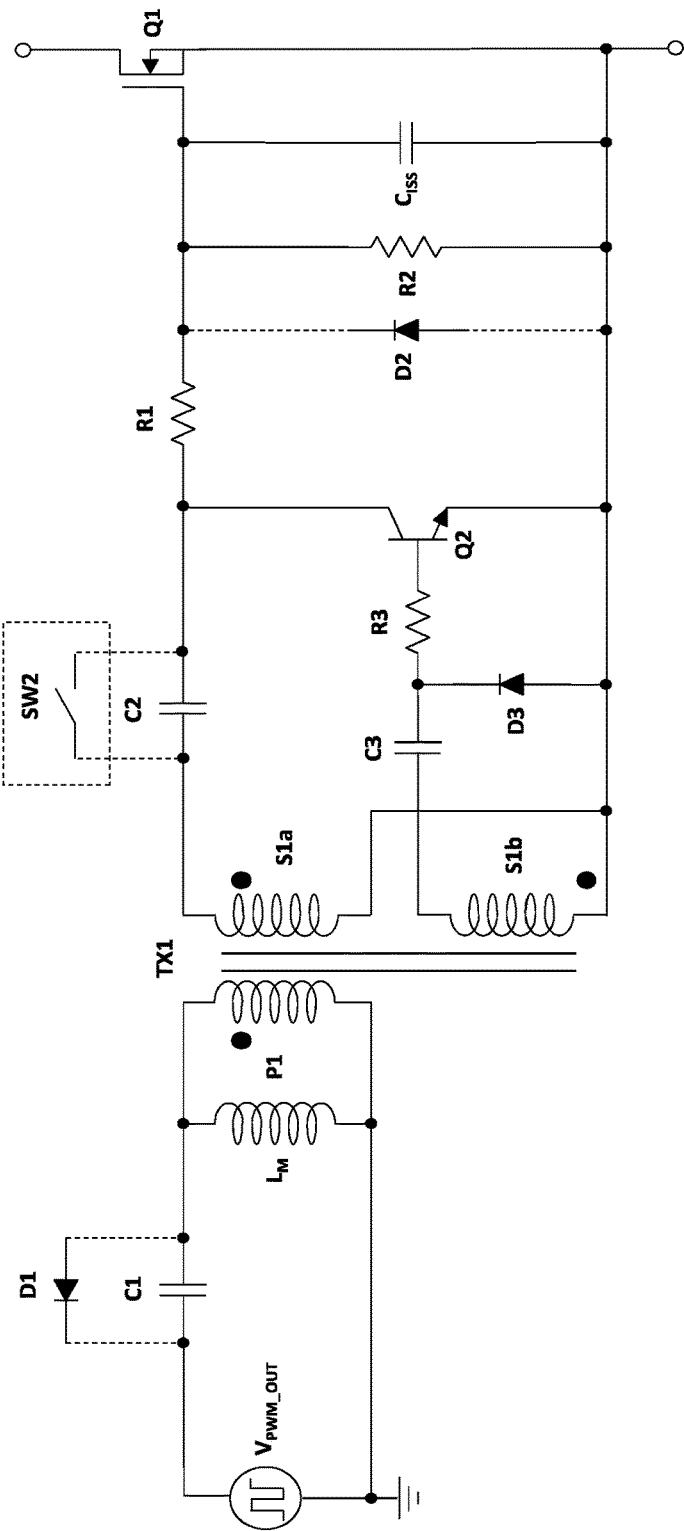

FIG. 17 is a schematic illustrating an isolated gate driver.

DETAILED DESCRIPTION OF VARIOUS EMBODIMENTS OF THE INVENTION

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

Embodiment #1 Operation

Figure 2:
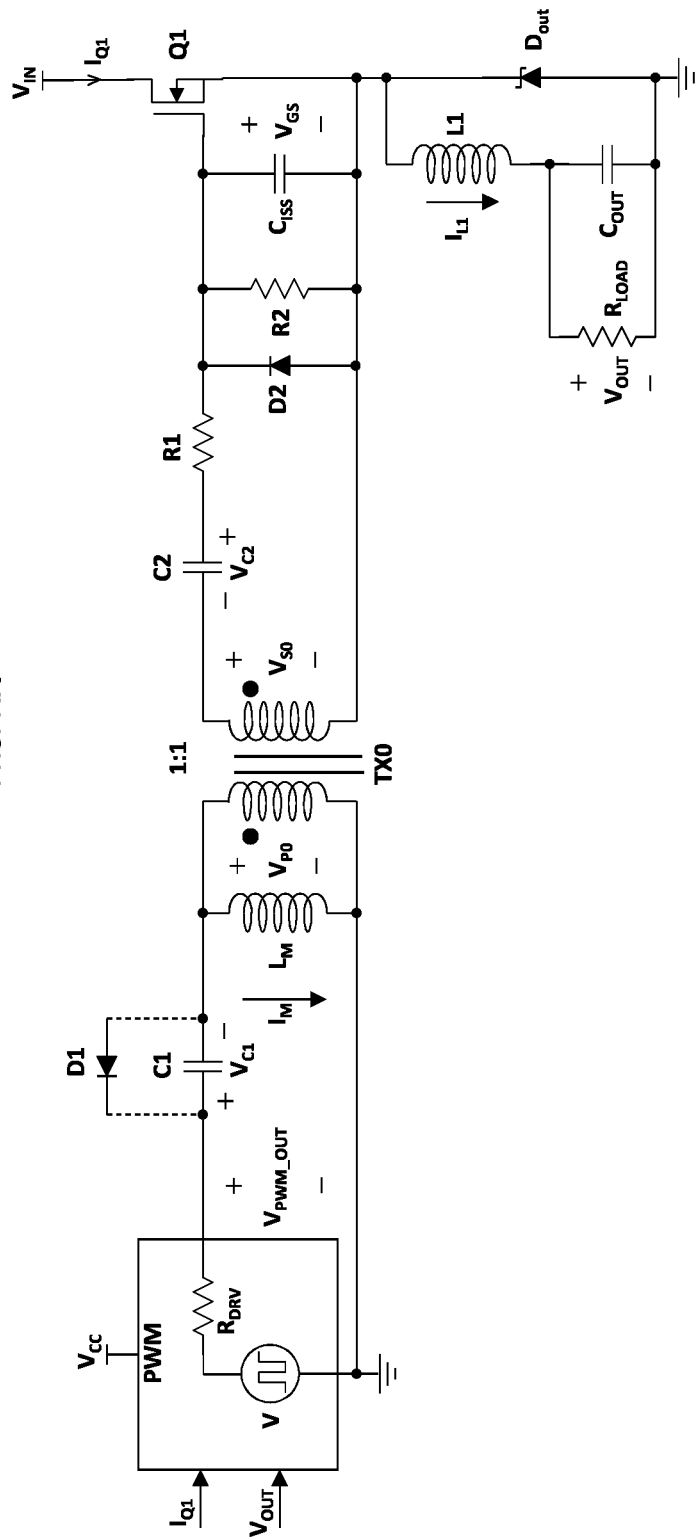
FIG. 2 is a schematic illustrating a transformer isolated high side gate driver using inter alia traditional DC-restore circuitry.

The various problems mentioned in the Background are solved with the modifications illustrated in FIG. 9 to the DC-restore circuit illustrated in FIG. 2 wherein X3 is a general four-port module containing various solutions discussed below. First, note that diode D1 across capacitor C1 is not always necessary. The major modification is that transformer TX0 has been changed to transformer TX1 having two secondary windings $V_{S1a}$ and $V_{S1b}$ with additional circuitry in X3 connected to $V_{S1b}$. However, the circuit is able to retain the use of 1:1:1 windings. This means a bifilar winding could be used for $V_{P1}$ and $V_{S1a}$ to reduce leakage inductance. This is less important for $V_{S1b}$ because, as disclosed below, the high resistance load dampens oscillations.

As before, $V_{PWM\_OUT}$ (with an internal output driving resistance $R_{DRV}$) is connected to the primary Vii of isolation transformer TX1 (having an internal magnetizing inductance LM) through DC blocking capacitor C1. Also, secondary winding $V_{S1a}$ is connected via DC-restore capacitor C2 and a small current limiting/damping resistor R1 to the gate of MOSFET Q1. (An optional switch (SW2) is used to implement another embodiment #2. either alone or in conjunction with this embodiment.) When $V_{S1a}$ (meaning the voltage across $V_{S1}$) is positive, it charges up the internal gate to source capacitance $C_{ISS}$ of Q1 with a return floating at the Q1 source potential. When $V_{S1a}$ goes negative, $C_{ISS}$ of Q1 is quickly discharged through the path of C2 and $V_{S1a}$. In addition, C2 is recharged via diode D2. Resistor R2 prevents the internal $C_{ISS}$ of Q1 from unintentionally charging up due to drain-to-gate leakage currents and turning on Q1 prior to a start-up routine of the PWM.

Referring to FIG. 9A, as shown by the dots in the usual manner, $V_{S1b}$ has the opposite polarity to $V_{S1a}$. Its low side is connected (through X3) to the floating source of MOSFET Q1. The high side connects via capacitor C3 to the cathode of diode D3 (whose anode connects to the source of Q1) and to one side of resistor R3. The other side of R3 connects to the base of small signal NPN transistor Q2 whose emitter is connected to the Q1 source. The collector of Q2 connects to the junction between C2 and R1.

When $V_{S1a}$ is positive during a PWM ON pulse, $V_{S1b}$ is negative and it charges up capacitor C3 via diode D3, leaving transistor Q2 non-conducting. When $V_{S1a}$ is negative during a PWM OFF pulse, $V_{S1b}$ is positive and current flows via resistor R3 into the base of Q2 causing it to conduct. Since the voltage, $V_{C2}$, across C2 is slightly less than $V_{S1a}$, C2 will be recharged to equal $V_{S1a}$ through the combined paths of Q2 and D2 in parallel. (R1 is small and can be neglected.) Charging through Q2 can occur because, though unusual for a bipolar junction transistor (BJT), Q2 can operate in the $3^{rd}$ quadrant (current flowing emitter to collector) while Q2 is recharging C2. This $3^{rd}$ quadrant operation of Q2 is not the major reason for Q2 being in the circuit. Nonetheless, if the $3^{rd}$ quadrant current gain of Q2 is sufficiently large, simulations showed that it can provide all or most of the recharging current for C2. However, this current gain is typically very small for BJT devices and can vary widely between component lots and manufacturers. To be able to use off-the-shelf transistors without having to make selections, D2 may optionally be retained in the circuit to ensure that C2 is sufficiently recharged every cycle.

From the foregoing, one might conclude that Q2 is not that useful. However, its use comes into play when the PWM is attempting to suddenly and quickly reduce the duty cycle to a very low value for current mode control operation (usually based on single cycle peaks, but can be an average of several cycles) after a short circuit is applied to the load. As discussed in the Background, when the PWM transitions from one duty cycle to a lower one, e.g., from Di to Df, the voltage $V_{C1}$ on capacitor C1 goes through a resonance oscillation starting from Di·V and ending at Df·V and, if Df·V<<Di·V, this can present problems. Also recall that during OFF pulses, C1 is directly across the primary of TX1. If $V_{C1}>V_{C2}$, C1 recharges C2 to $V_{C1}$ via diode D2 (DC-restoration). But if $V_{C1}<V_{C2}$, D2 does not conduct and C2 discharges very slowly via R2.

With the addition of Q2 and associated circuitry, something else happens. During an ON pulse, $V_{S1a}=V-V_{C1}$. This is normally positive so that $V_{S1b}$ is negative and charges up C3 via D3 so that $V_{C3}=V-V_{C1}$ with a positive polarity at the junction with D3 and R3, but $V_{D3}$ is negative and Q2 stays off. With an OFF pulse, $V_{S1a}=V_{P1}=-V_{C1}$ and if $V_{C1}<V_{C2}$, instead of restoring $V_{C2}$ to $V_{C1}$, $V_{S1a}$ sees an open circuit. However, $V_{S1b}=+V_{C1}$ which injects current into Q2 via R3. Since the collector to emitter voltage of Q2, $V_{CE}=V_{S1a}+V_{C2}=-V_{C1}+V_{C2}$, if $V_{C2}>V_{C1}$, Q2 turns on until $V_{C2}$ discharges to $V_{C1}$ plus the saturation voltage of Q2. Note that during ON pulses, C3 charges via D3 to $V-V_{C1}$ so that during an OFF pulse, the voltage at the junction of R3 and C3 across D3 is $V_{C1}+(V-V_{C1})=V$.

One should also note that transistor Q2 does not stay on for long. Initially, the current into the base of Q2 is (V–one diode drop of Q2 base-to-emitter)/R3. However, capacitor C3 charges up exponentially until the voltage across D3 drops below about +0.6 volts and current is no longer injected into the base of Q2 so it turns off. This takes about 3 R3C3 time constants. With V=10 volts, R3=249 ohms and C3=270 pF, (R3*C3=67 nsec) Q2 turns off in about 0.2 psec. This is long enough to equilibrate the difference in voltage between $V_{C1}$ and $V_{C2}$, but short enough to turn off before the next ON pulse. This depends on the beta of Q2, so to make sure, one can increase C3, e.g., to 1 nF. At the next ON pulse, simulations showed that $V_{S1b}$ going negative can still turn Q2 off. However, larger values can create a race condition where, since Q2 is still on in saturation, it shorts the PWM and no $V_{S1b}$ pulse is generated until after some delay. During an output short-circuit, $T_{OFF}$ long enough so this is not a problem but could be in normal operation with high duty cycles, where $T_{OFF}$ is short.

Moreover, unlike some other prior art, transistor Q2 is not needed to charge and discharge $C_{ISS}$. It may aid discharge quite a lot but, if it were removed entirely, the circuit would operate quite well as a traditional DC-restore. Thus, Q2 only need be fast enough to equilibrate $V_{C2}$ to $V_{C1}$, when $V_{C1}<V_{C2}$, during an output short when $T_{OFF}$ is long.

Embodiment #1A Simulations

FIGS. 10A-10E show the results of a simulated short circuit using the circuitry in FIG. 9A, but without diode D1 across C1. As in the Background discussion, the PWM is operating normally until t=10 psec with a duty cycle, D=0.8 which one can infer from the 8 volt value of $V_{PWM\_OUT}$ and $V_{C1}$ in FIGS. 10A and 10B, respectively. $V_{C2}$ is, as in previous simulations, charging within a diode drop of $V_{C1}$ during $T_{OFF}$ and discharging to charge Cm during $T_{ON}$. The voltage on the primary, $V_{P1}$ in FIG. 10C, $=V_{PWM\_OUT}-V_{C1}$. The scale in amps in FIG. 10E was magnified from previously so one can see the triangular charge and discharge of $I_{L1}$ more readily.

At t=10 psec, a short at the output occurs suddenly and the PWM transitions quickly from a high duty cycle (0.8 in this example) to a very low duty cycle (down to 0.06) to maintain cycle-by-cycle current limiting control of the output current. The control circuit maintains a continuous output short circuit current of approximately 2.5 amps as seen in FIG. 10E. Unlike, the previous simulations, it stays there throughout the decay of $V_{C1}$, even including a negative excursion past ωt=90 degrees out to about 180 degrees. As seen in FIG. 10D, during OFF pulses, $V_{GS}$ stays below 2 volts at all times. Whereas before. $V_{C2}$ decayed slowly, one can see in FIG. 10B that $V_{C2}$ tracks $V_{C1}$ rather closely, decaying slowly during an ON pulse, but getting reset close to the value of $V_{C1}$ during an OFF pulse. Also, unlike FIGS. 5A-5E where the inductor saturated at a point indicated by the arrow, it does not and the current is controlled.

FIGS. 11A-11E show a rerun of FIGS. 10A-10E, but with a diode D1 across C1 as shown in FIG. 9. Everything is similar except, after t=40 psec, $V_{C1}$ in FIG. 11B is clamped at one diode drop negative and $V_{GS}$ in FIG. 11D during $T_{OFF}$ is close to zero. This is because $V_{C2}$ settled to −2 volts once $V_{C1}$ was clamped to −0.9 volts (diode D1 has a higher voltage drop than the typical 0.6V due to the current magnitude during these transition events). During $T_{OFF}$, $V_{S1a}=+1.8V$ (DI voltage plus the voltage drop across the PWM driver output while it sinks current) which adds with the −2V charge on C2, thus $V_{GS}$ in FIG. 11D is near zero.

Very conveniently, the same circuit components in FIG. 9A, could still work for larger values of $<C_{ISS}>$ than shown in the simulations. To fix ideas, suppose $<C_{ISS}>$ increases 10X. Then, C1 and C3 should increase 10X. To equalize the voltages on C1 and C2, Q2 must transfer a charge $\Delta Q_2=C2 \cdot \Delta V_{C1}$ where $\Delta V_{C1}$ is the change in $V_{C1}$ (since $V_{C2}$ changes little) during $T_{ON}$, assumed unchanged but is relatively short. So $\Delta V_{C1} \approx dV_{C1}/dt \times T_{ON}$. After an event where the duty cycle drops rapidly, $V_{C1}$ oscillates as sin(ωt) which means $dV_{C1}/dt \propto \omega \cdot \sin(\omega t) \leq \omega$ at ωt=90 degrees, where ω=1/$(C1 \cdot LM)^{1/2}$. If C1 and LM increase 10X, ω=0.1X. Thus, maximum $\Delta Q_2=C2 \cdot \Delta V_{C1} \approx 10X \cdot 0.1X=1$ and is unchanged. Because TX1 functions as a transformer, it may not require changing unless larger wire gauge is desired or core saturation during a duty cycle transient becomes a concern with using a larger C1. If LM is unchanged, ω=1/$(10)^{1/2}$, so maximum $\Delta Q_2 \approx 3X$ which may not require a larger Q2.

Embodiment #1B

FIG. 9B illustrates an alternative to the circuitry in FIG. 9A, principally involving the substitution of a, preferably, small signal MOSFET for Q2 with a similar operation. The other difference is that resistor R3 is connected from the gate to source of Q2. To equilibrate $V_{C2}$ to $V_{C1}$ during a short-circuit $T_{OFF}$, the MOSFET should be selected so that $R_{DSON}*C2<<T_{OFF}$. With C2=33 nF and $T_{OFF}=2.6$ psec, $R_{DSON}<<80$ ohms, i.e., a few ohms. MOSFETs also operate in the 3$^{rd}$ quadrant. If relied on instead of D2 for DC-restoration during normal steady-state operation, $T_{OFF}$ can be quite a bit shorter and $R_{DSON}$ needs to be smaller. However, smaller $R_{DSON}$ comes with a larger $<C_{ISS}>$ which acts as a voltage divider with C3 so power MOSFETs are not desirable. (If one is used, there is the possibility of loading down the PWM.) Alternatively, one can use the body diode of MOSFET Q2 which will conduct when $R_{DSON}*I_{DS}>V_D \approx 0.8$ volts.

Given a $<C_{ISS}>$ of MOSFET Q2, C3 should be 3 or 4 times larger to produce $V_{GS}=7.5$ to 8 volts when $V_{S1b}$ goes to 10 volts. Q2 will stay on until $V_{GS}$ drops below $V_{TH}$. The time constant is R3*(C3+$<C_{ISS}>$). Exemplary component values (Embodiment #1A is discussed below with reference to FIGS. 12A & 12B) for a small signal MOSFET are: <Ciss>=300 pF, C3=1 nF and R3=249 ohms. Simulations yielded similar results to FIGS. 10A-10E and 11A-11E.

The advantage may be small, but it is possible to eliminate diode D3 if the R3*(C3+<$C_{ISS}$>) time constant is short compared to the shortest PWM ON pulse. If not, C3 would still be charged up when the PWM goes OFF and $V_{S1b}$ wont be able to drive current through it.

Embodiment #1A Exemplary Component Values

Figure 3:
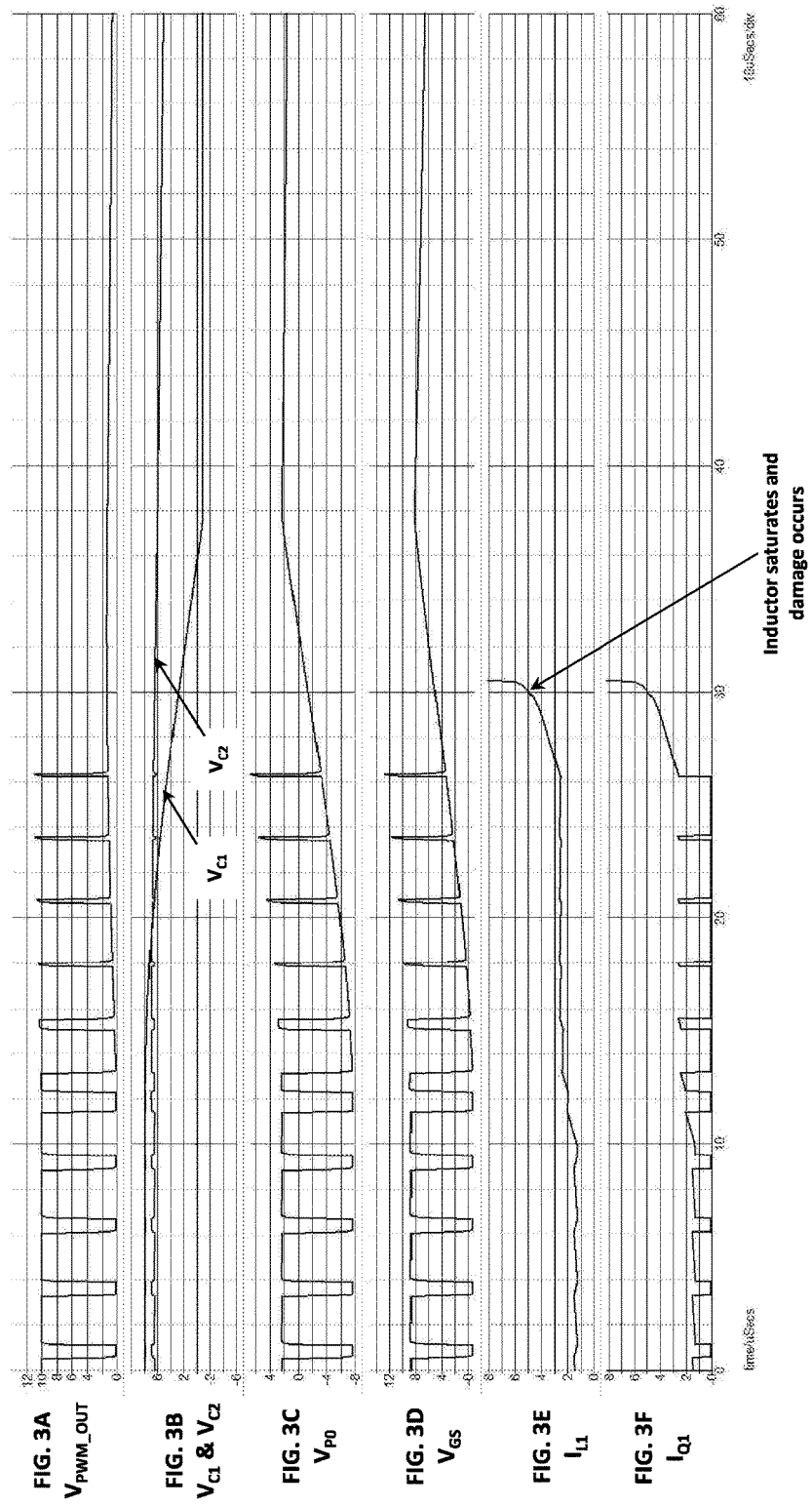
Figure 12A:
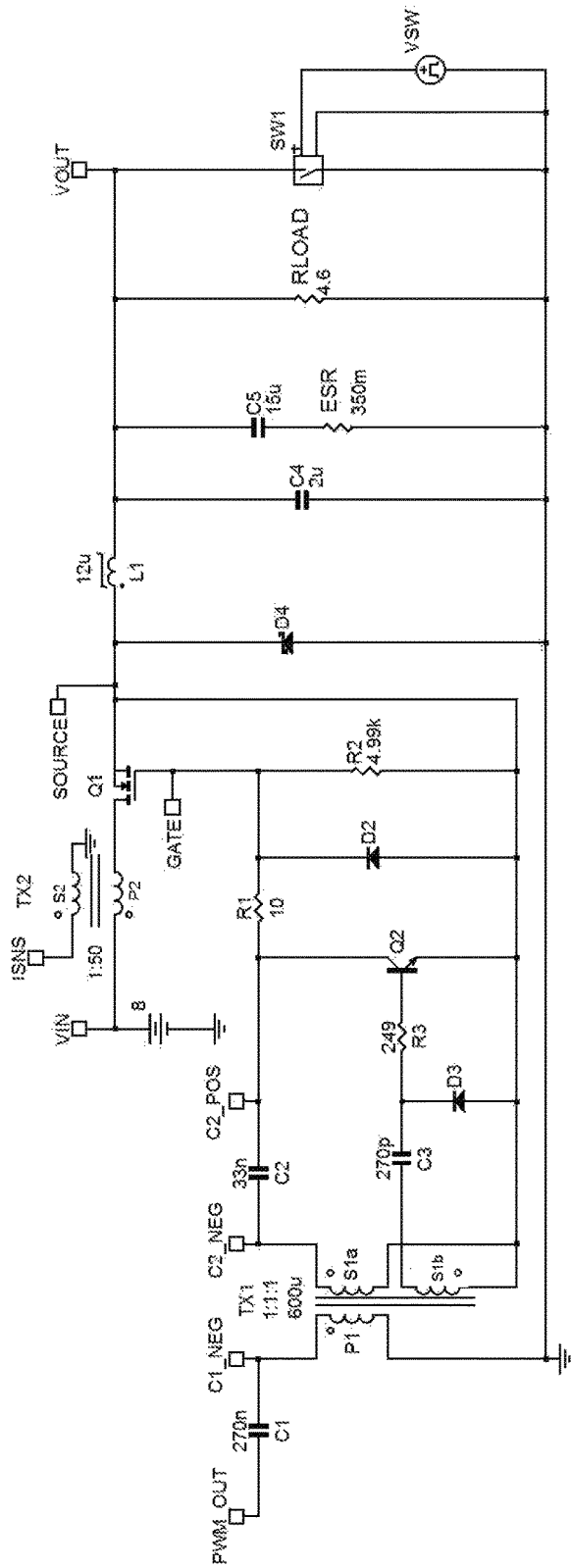
FIG. 12A is a schematic illustrating more fully the circuitry used to create the simulations shown in FIGS. 3A-3F, 5A-5E, 6A-6C, 7A-7C, 8A-8D, 10A-10E, & 11A-11E with suitable edits using the gate driver circuitry from FIG. 9A used for FIGS. 10A-10E & 11A-11E.
Figure 12B:
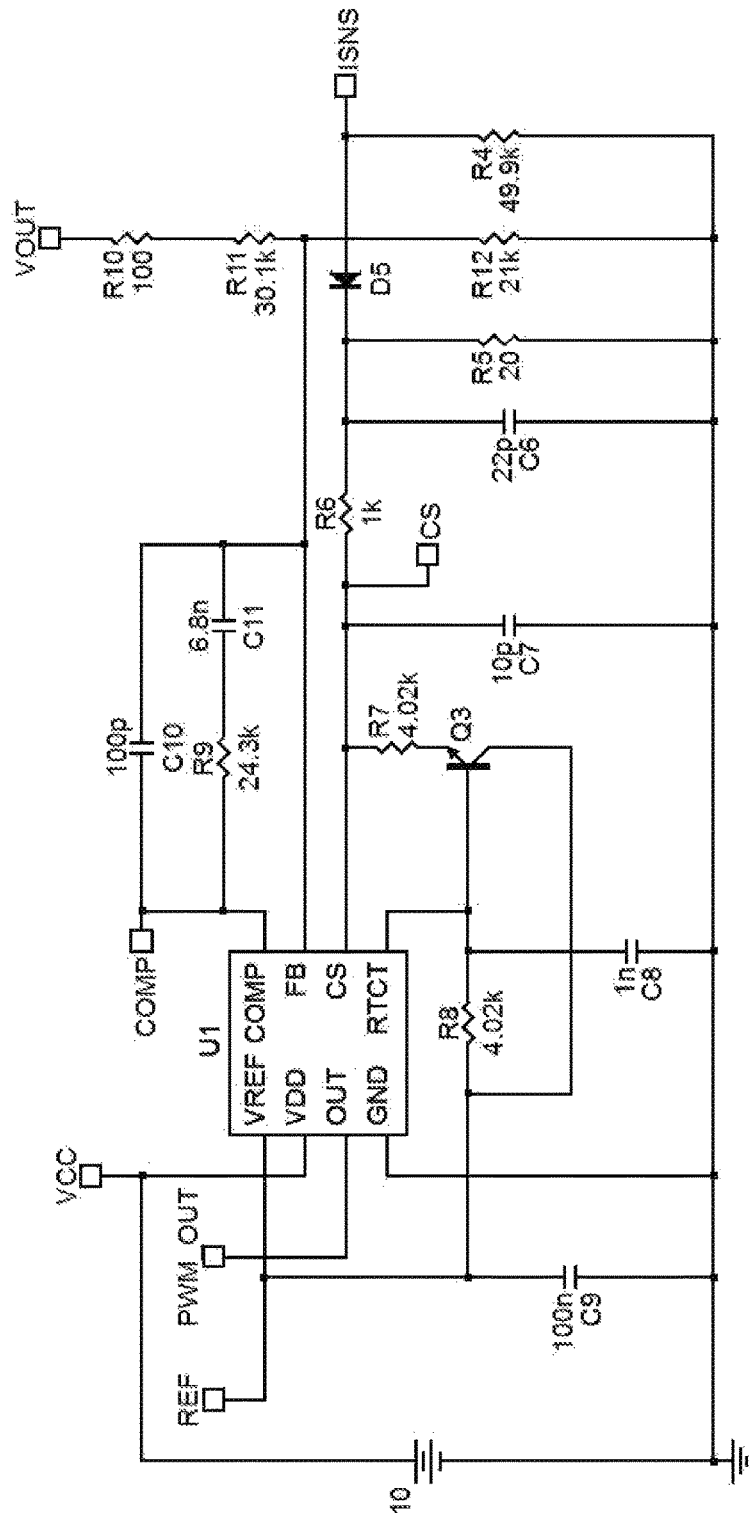
FIG. 12B is a schematic illustrating a PWM U1 and surrounding circuitry used to create the simulations referred to just previously.

FIG. 12A shows one embodiment of the invention used in a buck converter controlled by the PWM circuitry shown in FIG. 12B. This circuitry was used in all simulations with minor modifications to simulate the circuitry in, e.g., FIG. 3. To aid in easier understanding and because they were used in the simulations, values for components are shown next to the component designator. These values all conform to the E96 1%/ scale but, although desirable for some components, such precision is generally not needed. (1% resistors are now typically no more expensive than looser tolerances, so there is no reason not to use them even for nominal values.)

The buck converter shown in FIG. 12A is generally like the circuit discussed in FIG. 9A, but additional consideration related to choosing component values will be discussed. Like component designators are used for like functions in the previous figures. An exception is that capacitor $C_{OUT}$ in the previous figure has been replaced by the parallel combination of C4 and C5, a tantalum capacitor with an equivalent series resistance (ESR) of 350 milliohms. Though small in terms of power losses, the ESR has a measurable effect on the ripple of $V_{OUT}$ and, at the same time, can improve voltage feedback loop stability.

C5 is chosen to be large enough to provide good control loop stability in the presence of additional capacitance at the load as well as provide good load step response. L1 is chosen to be large enough to ensure continuous flow of current through it to reduce output voltage ripple and provide good efficiency by limiting the switching losses and current stresses on the free-wheeling diode D4. Given a $V_{IN}$, $V_{OUT}$, $R_{LOAD}$ or design current, $I_{OUT}$, and switching frequency F, determining these values is routine for PWM circuit designers. In this example, $V_{IN}$=8 volts, $V_{OUT}$, =6.1 volts, $R_{LOAD}$=4.6 ohms ($I_{LOAD}$=1.3 amps), and F=360 kHz.

For simulation purposes, ideal switch SW1 can be turned on by $V_{SW}$ to simulate a short circuit. GATE and SOURCE are test points in the simulation from which a gate-to-source voltage on Q1 is derived. Additionally, TX2 has been added. This is a current transformer used to sense the current flowing through Q1 with an output, ISNS, that goes to the PWM control circuitry illustrated in FIG. 12B. The rest of the circuit is used to drive the gate of Q1 as discussed in conjunction with FIGS. 9 and 9A.

PWM Simulation Circuitry:

FIG. 12B shows PWM control circuitry that uses a feedback loop to control $V_{OUT}$ by changing the duty cycle, D. More precisely, as is usual, a relatively slow voltage feedback loop (14 kHz unity gain bandwidth) changes the set point of an inner current control loop. To avoid sub-harmonics at duty cycles >50%, slope compensation is used. The details are not essential as long as the feedback loops are stable. This should be familiar to SMPS designers, but is included for the sake of completeness and to make it easier to duplicate the simulations.

Integrated circuit UI is a fairly typical PWM (in this example, it is an Intersil ISL78843ASRH) that provides several functions. The suggestively functional pin designations are those of the manufacturer. To operate correctly, it is surrounded by other components which are selected based on the manufacturer's recommendations and some routine design experience. It is powered by a DC voltage, $V_{CC}$. The return is via GND connected to local ground. The magnitude of $V_{PWM\_OUT}$ is limited to $V_{CC}$. Manufacturers generally provide an internal functional diagram, but the invention is not limited to any particular PWM, so it will be described as a generic black box with values being exemplary.

$V_{OUT}$ is fed back to a voltage divider consisting of resistors R10, R11, and R12. Internally, this is fed into pin FB and compared to a 2.5 volt reference. Low $V_{OUT}$ occurs if it is less than 6.1 volts, hereinafter, the set point, $V_{SET}$=6.1 volts. Internal error amplifier (an op amp) compensation is provided by feedback capacitor C10 in parallel with resistor R9 in series with capacitor C11 according to the manufacturer's recommendations. At low frequencies, the amplifier integrates the error, $V_{OUT}-V_{SET}$. Above 1 kHz, the amplifier has an inverting gain of about 0.8. This internal amplifier is connected to the negative side of an internal comparator, hereinafter PWM COMP.

Input pin CS is used for current sensing and limiting and is connected to the positive side of PWM COMP. When the voltage on CS exceeds a scaled down version of the op amp output, up to 1 volt for this PWM, PWM COMP is tripped which turns off $V_{PWM\_OUT}$. Resistor R4 ensures that the TX2 transformer core is reset every cycle while keeping the winding reset voltage below the breakdown rating of D5. When a positive pulse of current flows through the primary P2, current is induced in the secondary S2 proportional to the primary to secondary turns ratio. This flows through diode D5 and resistor R5. The voltage across R5 is summed through R6 with the slope compensation ramp derived from Q3 through R7. This slope compensation is used in the current feedback loop to prevent sub-harmonic instabilities when operating the converter at duty cycles 50% or greater. At the trailing edge of the PWM pulse for steady-state operation (above 50% duty cycle), the contribution of the voltage at the CS due to the slope compensation ramp may be significant. However, if the duty cycle becomes very small during an output short-circuit event, this contribution becomes very small and voltage on the CS pin is nearly the same as the voltage across R5, which is a scaled version of the sense inductor current from L1. If for example, the duty cycle is very small during an output short circuit event and the turns ratio of TX2 is 1:50, 2.5 amps (hereinafter the current limit $I_{CL}$) in the primary will produce 50 mA in the secondary which will produce 1 volt across R5. Since the input impedance of PWM COMP is large and the contribution due to the slope compensation ramp is negligible, it will appear at CS and trigger it. Capacitor C6 and resistor R6 in combination with capacitor C7 filter out high frequency noise as well as the narrow current spike that typically occurs on the leading edge of the sense current waveform due to the junction capacitance of D4 and the intra-winding capacitance of L1.

In operation, the current through the primary of TX2 (see FIG. 12A) consists of unidirectional pulses when Q1 is ON and zero when it is OFF. When the primary current goes to zero, i.e., it is an open circuit, the magnetic core is rapidly reset via current flowing through R4. The magnetizing inductance of TX2 in this example is 3 mH on the secondary winding. For simulations, TX2 is designed not to saturate for any currents well above $I_{CL}$ to handle extremes. Thus, the voltage at the top of R5 is designed to be a faithful reproduction of current through Q1.

This PWM has an internal clock, CLOCK, with a maximum switching frequency of 1 MHz and a maximum duty cycle of, typically, 96%. These are set by R8 and C8. Capacitor C8 charges up for a period $T_{ON}$ via R8 and is discharged by in internal current sink for a period $T_{OFF}$. The voltage at pin RTCT is a saw tooth from 1 to 3 volts for this PWM. At duty cycles greater than 50%, it is necessary to provide additional slope compensation to maintain stability for the feedback loop. This is provided by R7 and NPN transistor Q3. Slope compensation is rather complex to describe and is not needed to understand the invention. C9 is a filter capacitor for an internal DC reference, $V_{REF}$.

In operation, CLOCK free runs at the maximum duty cycle which drives a high current (1 amp maximum) buffer to produce $V_{PWM\_OUT}$ which turns Q1 ON and OFF. The clock is also gated by an override from PWM COMP. The transition of PWM COMP from low to high triggers an internal flip flop followed by a few logic gates which terminates the $V_{PWM\_OUT}$ pulses every cycle. This is known in the industry as fixed frequency, trailing edge modulation which is the method that the PWM uses to maintain the proper output voltage and output current based upon conventional closed-loop control circuit operation. The PWM circuit in FIG. 12B is configured to operate using conventional peak current-mode control, which is a control method commonly used to provide good stability performance with a variety of different loads and load capacitance with the added benefit of using the sensed current to control the output current during an overload or short circuit condition. The current-mode control configuration requires separate voltage and current feedback loops. In normal operation when $V_{OUT}=V_{SET}$, both feedback loops are closed and operating in an analog fashion to keep the converter in a stable state and provide the desired output voltage and current. However, in an overload condition (which may include an output short circuit), $V_{OUT}<V_{SET}$, and the voltage loop will deviate out of closed-loop active control but the current loop will remain closed and maintain a constant and stable output current, which in our example is approximately 2.5 A.

Referring to FIG. 12A, in normal operation, as explained previously, when Q1 is ON, current in the inductor L1, $I_{L1}$, increases at a rate of $(V_{IN}-V_{OUT})$/L1. When Q1 is OFF, current decreases at a rate of $V_{OUT}$/L1, generating a triangular waveform. The PWM adjusts the duty cycle, D, to regulate $V_{OUT}$ with the result that in equilibrium $V_{OUT} \approx D \cdot V_{IN}$ and $I_{L1}=I_{OUT}+$ a triangular ripple current with a peak-to-peak magnitude equal to $V_{OUT} \cdot (1-D) \cdot T/L1$. In this example, $I_{L1}=1.3\pm0.17$ amps. This is well below the 2.5 amp current limit.

In the event of a fault such as a short circuit on the output, $V_{OUT}=0$. As long as this is true, $V_{OUT}<<V_{SET}$, and the operation of the PWM is entirely controlled by the current limit circuitry.

When Q1 is OFF, the current $I_{L1}$ continues through $I_{L1}$ via D4. Since $V_{OUT}=0$, the only voltage on L1 is one diode drop (typically, 0.45 volts for a Schottky diode). Thus, the current decays slowly, for this example, at 0.45 volts/12 uH≈0.04 amps per μsec. When Q1 is ON, the voltage across inductor L1, which is normally $V_{IN}-V_{OUT}$, is now $V_{IN}$, in this example 8 volts vs. 2 volts. Thus, the current increase through Q1 during the ON period after a short is much more rapid than normal, about 0.66 amps per psec in this example.

After a current limit is detected, $V_{PWM\_OUT}$ is forced low. What happens on the next pulse depends on when the short occurred in the last ON pulse. However, this PWM, like many, operates as a constant current source by providing narrow pulses every switch cycle with $I_{OUT}=I_{CL}$. In a quasi-steady state (skipping over the initial transition) when Q1 is OFF, the voltage at pin CS drops to zero and the current limit is off, enabling $V_{PWM\_OUT}$ on the next pulse. Assume $I_{L1}$ is slightly below $I_{CL}$. Then when Q1 is turned ON, $I_{L1}$ increases rapidly to $I_{L1}=I_{CL}$ and $V_{PWM\_OUT}$ is turned OFF. With Q1 OFF, $I_{L1}$ decays below $I_{CL}$ and the cycle repeats. In a steady state, the current into L1=the current out. This means $V_{IN} \cdot T_{ON}$/L1=(0.45 volts)·$T_{OFF}$/L1. Since $T_{ON}=D \cdot T$ and $T_{OFF}=(1-D) \cdot T$, with $V_{IN}=8$ volts, D=0.06 and $T_{ON}=D \cdot T=$only 0.19 psec in the present example. This continues until the short is removed at which point the output voltage starts to rise by the charging of the output capacitors via the inductor current. The rising output voltage, during $T_{OFF}$, causes $I_{L1}$ to decay more rapidly and D increases to supply the load current and maintain proper output voltage.

If, however, for any reason, the gate drive circuitry for Q1 causes the gate-to-source voltage to exceed $V_{TH}$ for an extended period, the PWM will have no effect, Q1 will remain ON and $I_{L1}$ will increase and could reach a level that would damage Q1.

Simulations:

To simulate operation of the circuits in the figures, a commercially available SIMetrix/SIMPLIS switching power supply software simulator from SIMPLIS Technologies, Inc., Portland, Oreg. was used.

In the simulations, all resistors and capacitors were assumed ideal except the ESR of C5 was included. For the simulations, L1 was designed from scratch, to be similar to the commercial Coilcraft inductor part number MSS 1246-123ML. The magnetizing inductance of TX1 and TX2 were included. TX1 was modeled as having a bifilar winding for the primary and first secondary ($V_{P1}$ to $V_{S1a}$) to reduce leakage inductance. No effects were seen for the second secondary ($V_{S1b}$) and TX2. Power diode D4 was modeled as a general purpose Schottky diode which behaves very similarly to a 1N5822. All other diodes were 1N4148 small signal diodes. Q0 was modeled as an ON Semiconductor 2N7002 small signal logic-level MOSFET and Q1 was modeled as a Vishay Semiconductor IRF7495PbF power MOSFET. Q2 and Q3 were 2N2222A NPN transistors. As noted, UI was an Intersil ISL78843ASRH. SPICE or SIM-PLIS device models were obtained from the manufacturers for all semiconductor components, except for the Schottky diode D4 which was modeled more generically as mentioned before.

Figure 4:
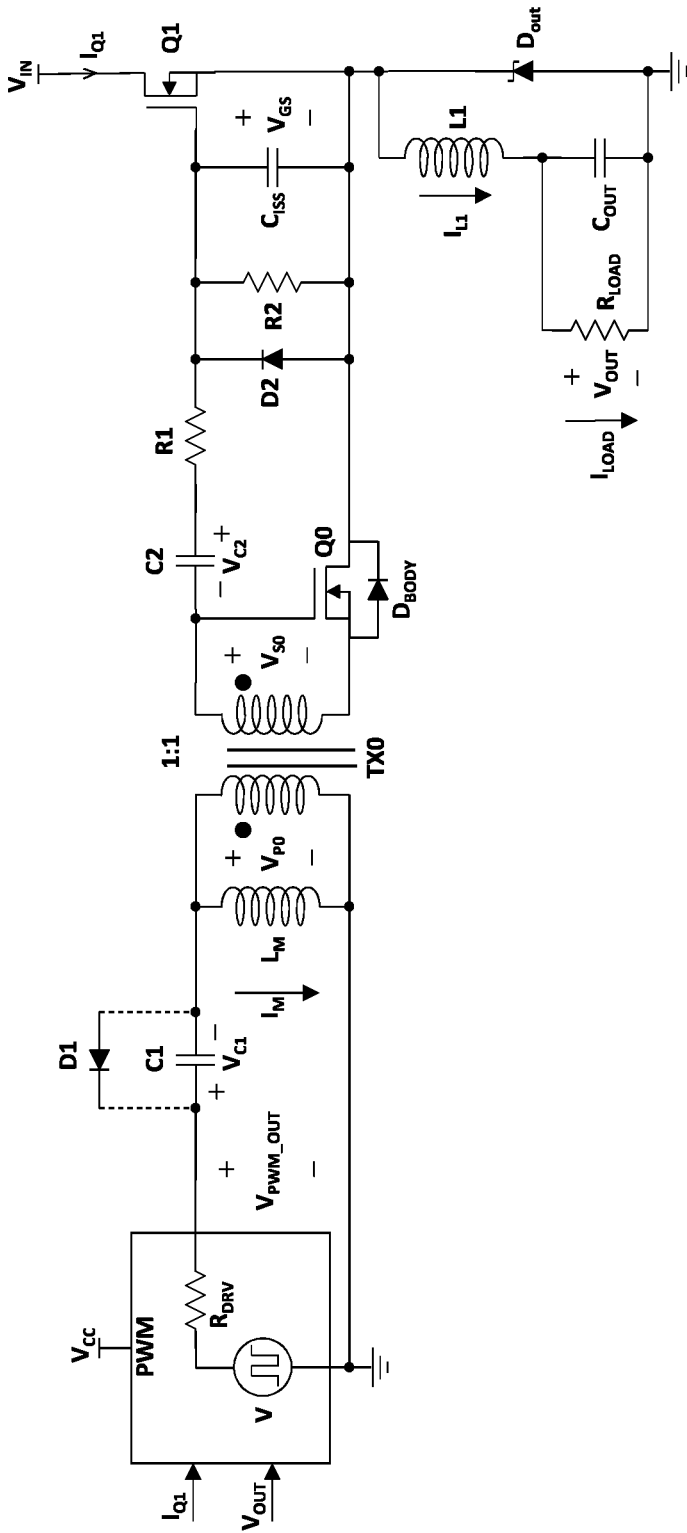
FIG. 4 is a schematic illustrating a prior art improvement to the gate driver illustrated in FIG. 2.

To run the simulations, suitable changes were made to the gate drive circuit in FIG. 12A. For instance, to simulate the gate drive in FIG. 2, the secondary winding S1b of TX1 was removed along with C3, D3, R3 and Q2. A FIG. 4 simulation was obtained by modifying FIG. 2 with the insertion of Q0. FIG. 9A is the gate driver circuitry in FIG. 12A with generic designator Cout for C4 and C5.

Embodiment #2

Figure 13:
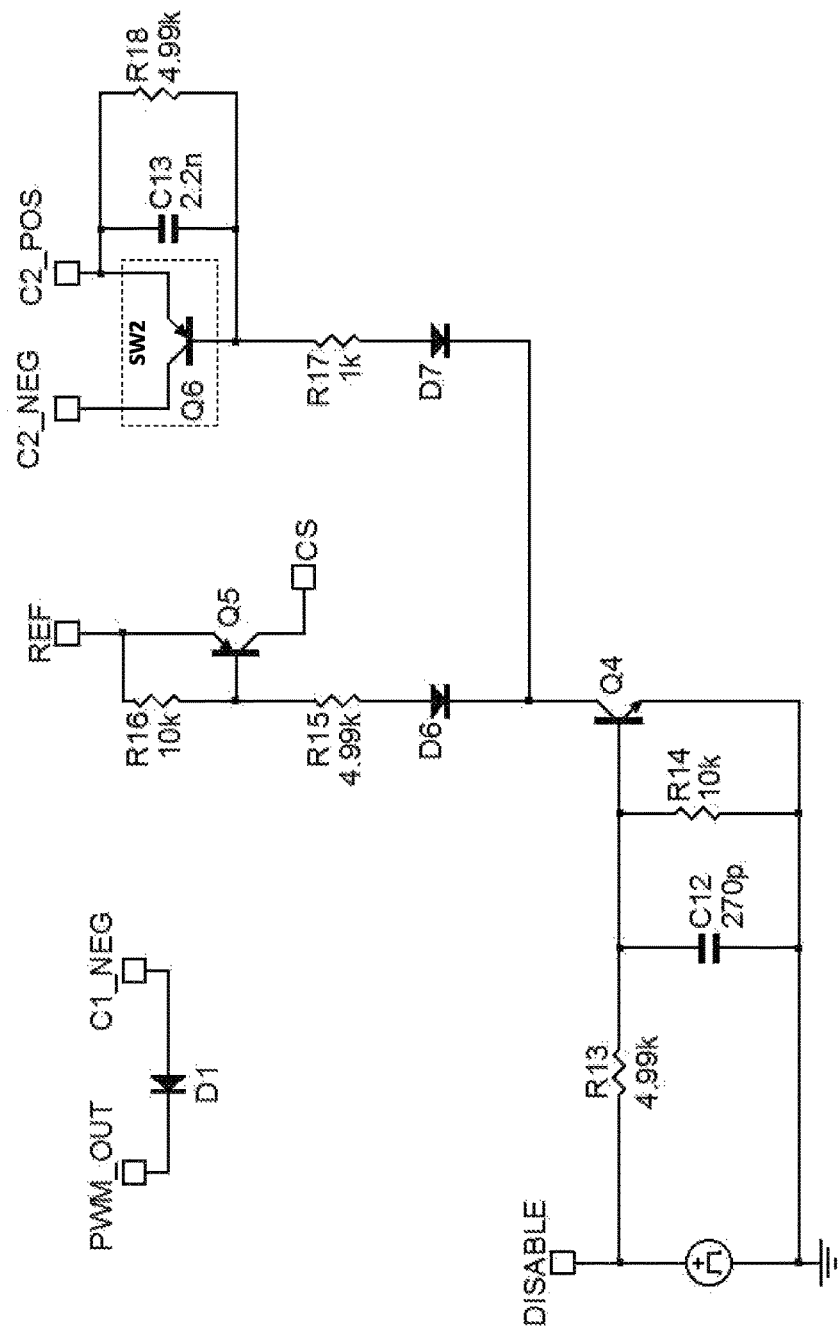
FIG. 13 is a schematic illustrating a further improvement on the circuitry in FIG. 9 for situations when it is desired to de-energize the DC restore circuit when the PWM shuts down.

Another embodiment of the invention is illustrated by FIG. 13 which is an add-on to the circuitry illustrated in FIGS. 12A and 12B. This embodiment solves a different, though somewhat related, problem than the previous embodiments and operates independently of it. The problem is to prevent the output, $V_{OUT}$, from an over-voltage condition by preventing the gate driver circuitry, e.g., in FIG. 9, from inadvertently turning on power MOSFET Q1 after the PWM is commanded to shut down. The difference is that this is not in response to a short on the output; $R_{LOAD}$ stays at its normal value.

For this embodiment, the diode D1 across capacitor C1 in FIG. 13, which is not optional, is shown making a connection with nodes PWM_OUT and C1_NEG. The rest of the circuitry shuts down the PWM from an external signal, DISABLE, and discharges the capacitor C2 in the DC-restore circuitry as follows.

When a DISABLE logic signal is received, current flows through resistor R13 into the base of NPN transistor Q4 with its emitter at local PWM ground, and turns it on. This is the same ground as shown in FIGS. 12A and 12B. Capacitor C12 filters high frequency noise from the base of Q4 to ground. Resistor R14, connected from the base of Q4 to ground, prevents leakage currents from the collector of Q4 from turning it on.

When Q4 is turned on, it pulls the circuitry connected to its collector to near ground potential. The emitter of PNP transistor Q5 is connected to pin VREF on IC UI (the PWM) via attachment point REF as shown in FIG. 12B. As discussed in reference to FIG. 12B, the voltage at pin VREF is 5 volts above ground. The collector of transistor Q5 is connected to input pin CS of IC U1. This is the current-sensing input of the PWM for the current loop feedback control and it also terminates the $V_{PWM\_OUT}$ pulse early if an over-current condition is detected on a cycle-by-cycle basis.

Resistor R16 is connected to attachment point REF and the base of Q5 which is also connected to resistor R15 which connects to the anode of diode D6 whose cathode connects to the collector of Q4. When Q4 turns on, current is pulled from the base of Q5 limited by resistor R15 and Q5 turns on. As discussed with respect to FIG. 12B, pin CS is connected to a high input impedance comparator so the only load on the collector of Q5 is resistor R6 (in FIG. 12B) with an indicated value of 1 kohm. Thus, if Q5 has a reasonable beta, pin CS will be pulled up to almost 5 volts, but this does not exceed the 6 volt maximum for this particular IC U1. Resistor R16 keeps transistor Q5 from turning on due to leakage currents from Q4.

PNP transistor Q6 has its collector connected to the C2_NEG node of capacitor C2 on the secondary side of transformer TX1 illustrated in FIG. 12A. The emitter of Q6 is connected to the C2_POS node on the same capacitor. As POS and NEG indicate, capacitor C2 is normally charged to that polarity. Capacitor C13 and R18 are connected in parallel across the base and emitter of Q6. These filter high frequency noise and prevent leakage currents deriving from Q4 from turning on Q6, respectively. The base of Q6 also connects to resistor R17 which connects to the anode of diode D7 whose cathode connects to the collector of Q4. Transistor Q6 is an implementation of a more general switch (SW2).

When a DISABLE signal is received, Q4 is turned on and pulls current from the base of Q5 via resistor R15 and diode D6. Q5 turns on and pulls $V_{CS}$ up to +5V, which immediately terminates the output pulses from the PWM since 5V is greater than the 1V threshold that VCS uses to determine an output overload condition. In addition, Q4 also pulls current from the base of Q6 via resistor R17 and diode D7. However the base current will be near zero until node C2_POS rises to about two diode drops plus the saturation voltage of Q4 above ground. Only after that will transistor Q6 conduct and discharge capacitor C2.

Referring now to FIG. 12A, the secondaries S1a and S1b of transformer TX1 are floating above the potential of node SOURCE (the source of MOSFET Q1). As will be made clear below, transistor Q2 and associated base drive circuitry connected to secondary winding S1b have negligible effect on the operation of this embodiment and can be assumed not in the circuit.

As explained above, transistor Q6 does not conduct until node C2_POS, connected to its emitter, is +1.5 volts above ground. Because R1 is small, the potential of node C2_POS is the same as node GATE which is at voltage $V_{GS}$ with respect to node SOURCE. Before a DISABLE signal is received, when Q1 is ON, node SOURCE is at about $+V_{IN}$. When Q1 goes OFF, even during normal operation, $I_{LOUT}$ decays in L1 through diode D4, and node SOURCE is the diode drop of D4 below ground. Q1 goes OFF because $V_{GS}=V_{C2}-V_{C1}<0$. Then, node C2_POS, at the same potential as node GATE, is not above ground. If, for some reason, $V_{GS}>V_{TH}$ and Q1 is ON (when it should be OFF) and node SOURCE rises above ground and a DISABLE signal has enabled Q6, then Q6 will discharge capacitor C2 so that $V_{GS}<V_{TH}$. This is a fail-safe feature of this embodiment, discussed after simulation results are presented.

Assuming normal operation, after a DISABLE signal, the PWM goes OFF and stays OFF, as does Q1 leaving the reverse bias capacitance of D4 (about 200 pF) charged up to V. This will be discharged as well as charging the drain to source capacitance of Q1 (in a few nsec) by the current through inductor L1, $I_{L1}$, until D4 starts to conduct. Then $I_{L1}$ will decay to zero as $(V_{OUT}+V_D)/L1=0.54$ amps/usec here, taking about 2.4 usec to reach zero (during which node C2_POS will be the diode drop of D4 below ground). However, during the decay, $I_{L1}$ is still providing some current to the load. Afterwards, $V_{OUT}$ will decrease as the output capacitors C4 and C5 supply current into the load. $R_{LOAD}$. Here the time constant is about 78 usec. When $I_{L1}=0$, diode D4 stops conducting and node SOURCE rapidly jumps up to the value of $V_{OUT}$ at the end of the decay (almost 6.1 volts here). Since, because of diode D2, nodes GATE and C2_POS can't initially be more than a diode drop below $V_{OUT}$, PNP transistor Q6 turns on and discharges capacitor C2, thus ensuring that Q1 is OFF.

Diodes D6 and D7 are there to prevent unwanted leakage currents and interactions between Q5 and Q6 when the converter is running in steady state operation.

Figure 14:
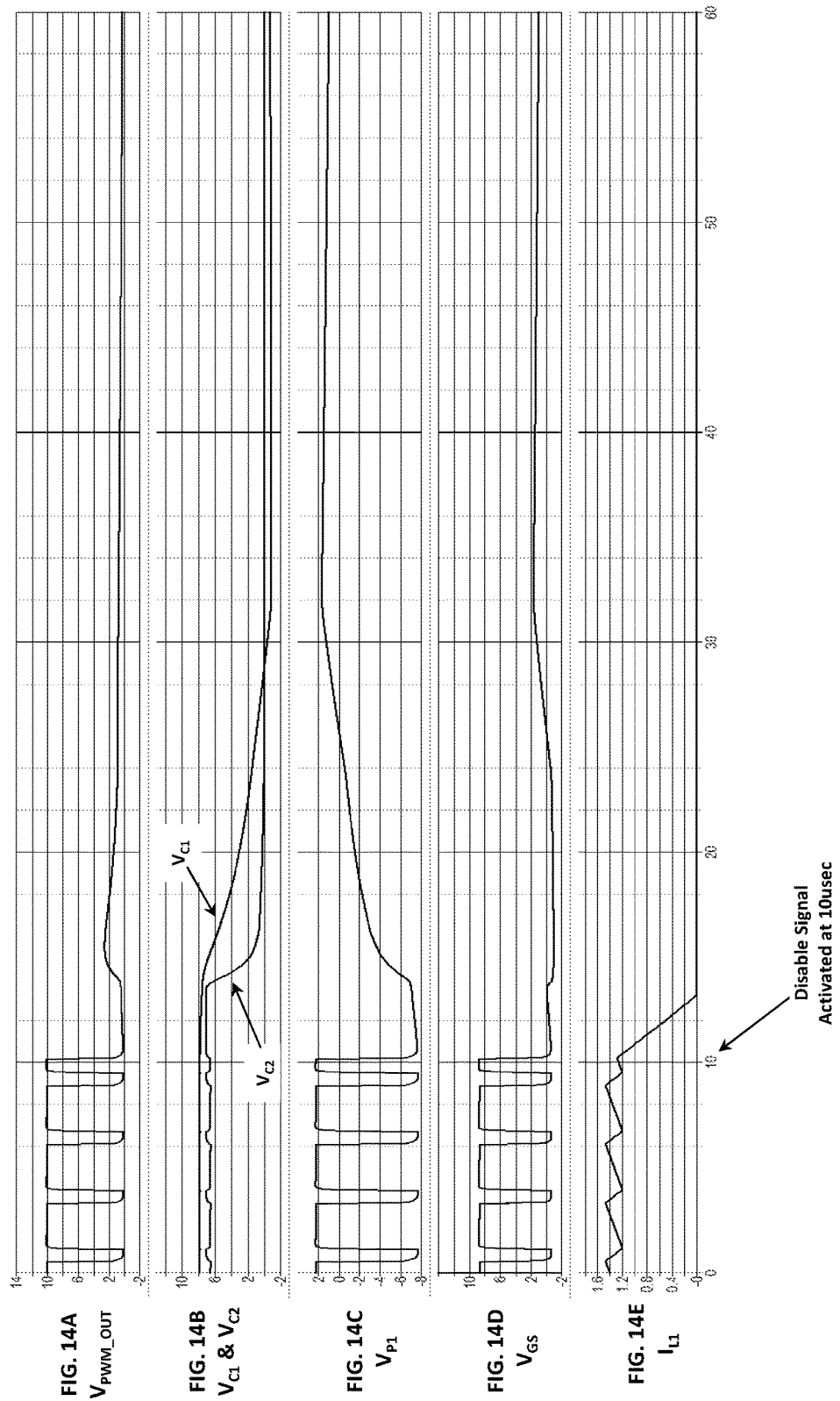

FIGS. 14A-14E show the results of a simulated shutdown using the additional circuitry illustrated in FIG. 13 which includes the switch module X3 shown in FIG. 9A. As previously, the PWM in FIG. 14A is operating normally until t=10 psec with a duty cycle, D=0.8. $V_{C1}$ and $V_{C2}$ in FIG. 14B are behaving normally at about +8 volts. In FIG. 14C, $V_{P1}$ is toggling from −8 to +2, but $V_{GS}$, in FIG. 14D, is restored to toggle from 0 to +8 volts. In FIG. 14E, one can see a ±0.17 triangle wave about a 1.3 amp DC level for $I_{L1}$.

Also referring to the schematic in FIG. 13, at t=10 psec, a DISABLE signal is activated as indicated by the arrow and the PWM obviously shuts down by observing that the PWM output pulses suddenly stop. At first nothing else happens, but $I_{L1}$ decays through diode D4 to 0 amps by t=13 usec. During this time node C2_POS is a diode drop below ground and the emitter diode of Q6 is backed biased and can't turn on, so C2 is not affected. Shortly after $I_{L1}$ drops to zero, as explained above, node C2_POS rises to essentially $V_{OUT}$ and Q6 can turn on and discharge C2 as shown in FIG. 14B where $V_{C1}$ is decaying as usual.

Before t=10 usec, Q2 in switch module X3 turns on whenever $V_{PWM\_OUT}$ turns OFF but, since $V_{C1}>V_{C2}$, it does not conduct except possibly in the $3^{rd}$ quadrant in parallel with D2. At t=10 usec, Q2 turns on for the last time for about three R3C3 time constants, about 200 nsec. Thus, switch module X3 does not materially affect the operation of Embodiment #3. In FIG. 14C, after t=14 usec, one can see that the decay of $V_{C1}$ induces a voltage on the primary which drives a current through the output impedance $R_{DRV}$ (see FIG. 9) of the PWM and $V_{PWM\_OUT}$ rises in response to the decay of $V_{C1}$. But this does not matter because $V_{C2}$, in FIG.

14B, falls to zero while $V_{P1}=V_{S0}$, in FIG. 14C, is still negative, so $V_{GS}$ in FIG. 14D is negative, limited by the diode drop of D2. At t=33 psec, $V_{C2}$=0, $V_{C1}$=minus a diode drop (because of D1), but $V_{P1}$ has become slightly positive due to the current still flowing in $R_{DRV}$, so $V_{GS}$ is slightly positive at +2 volts. After that, everything slowly decays to zero and Q1 does not turn on after a shutdown.

Referring to FIG. 12A, a very useful fail-safe feature is predicted for the following scenario. If some later event causes the parallel combination of the $C_{ISS}$ of MOSFET Q1 and capacitor C2 to charge up to $>V_{TH}$ causing Q1 to barely start turning on in the device's linear region and provide a small drain current ($V_{S1}=V_{P1}$=0, so $V_{GS}=V_{C2}$), SOURCE would start to rise above two diode drops above ground, turning on Q6 which would discharge C2 (and $C_{ISS}$) below the $V_{TH}$ of Q1 which would turn off almost immediately after starting to barely turn on. In this scenario, Q1 would be turned off much sooner before SOURCE charges all the way up to $V_{IN}$, (which occurs if Q1 turns on fully) thus preventing an output over-voltage event. The cycle could repeat, but $V_{OUT}$ would not rise by much over 1.2 volts and MOSFET Q1 would never be on long or completely enough to cause a level of current $I_{Q1}$ that could lead to an over voltage.

Embodiment #3

Figure 15:
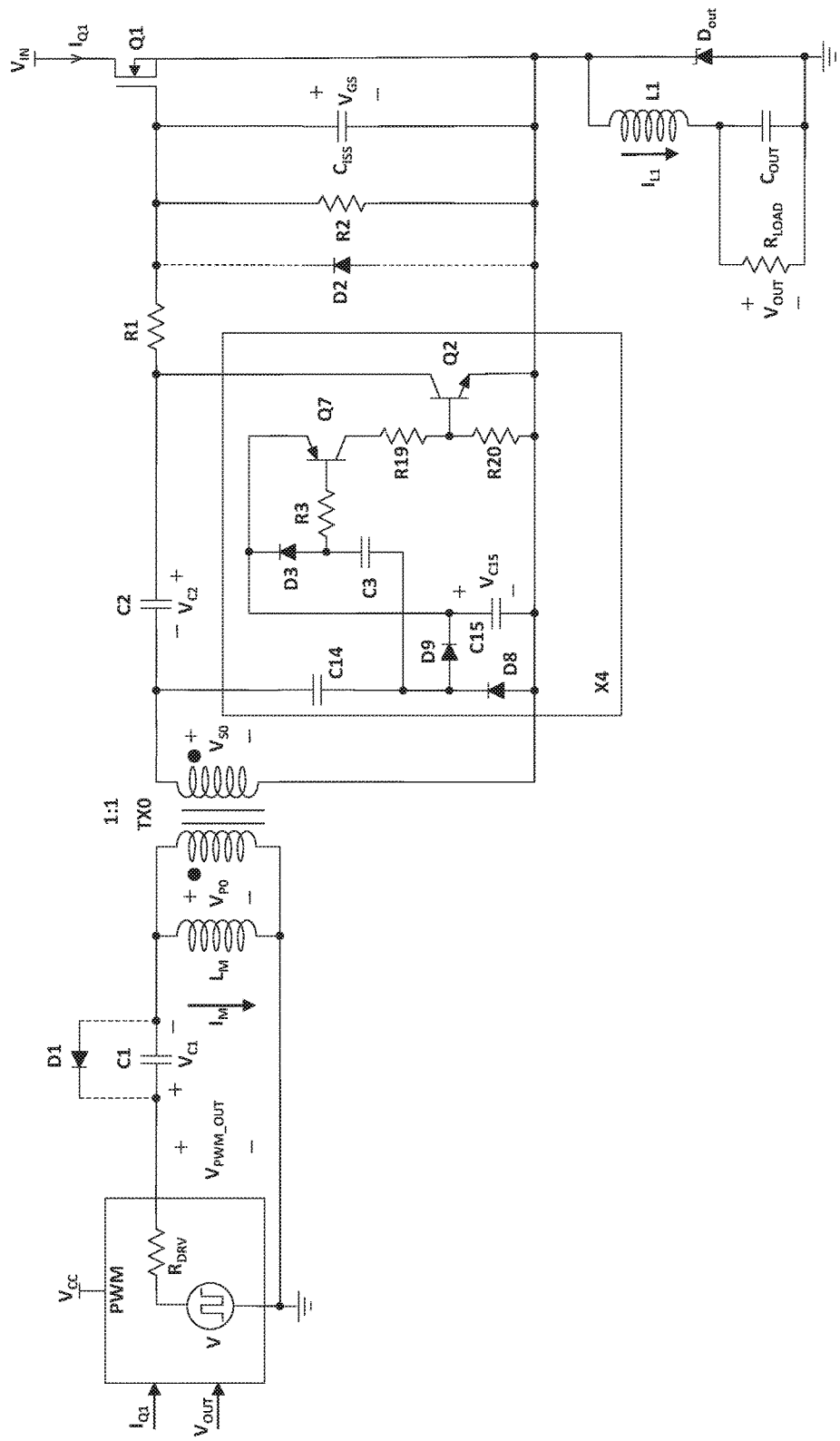
FIG. 15 is a schematic of an alternate to the improvements to the gate driver circuitry in FIG. 2 schematically illustrated in FIGS. 9, 9A, & 9B.
Figure 16:
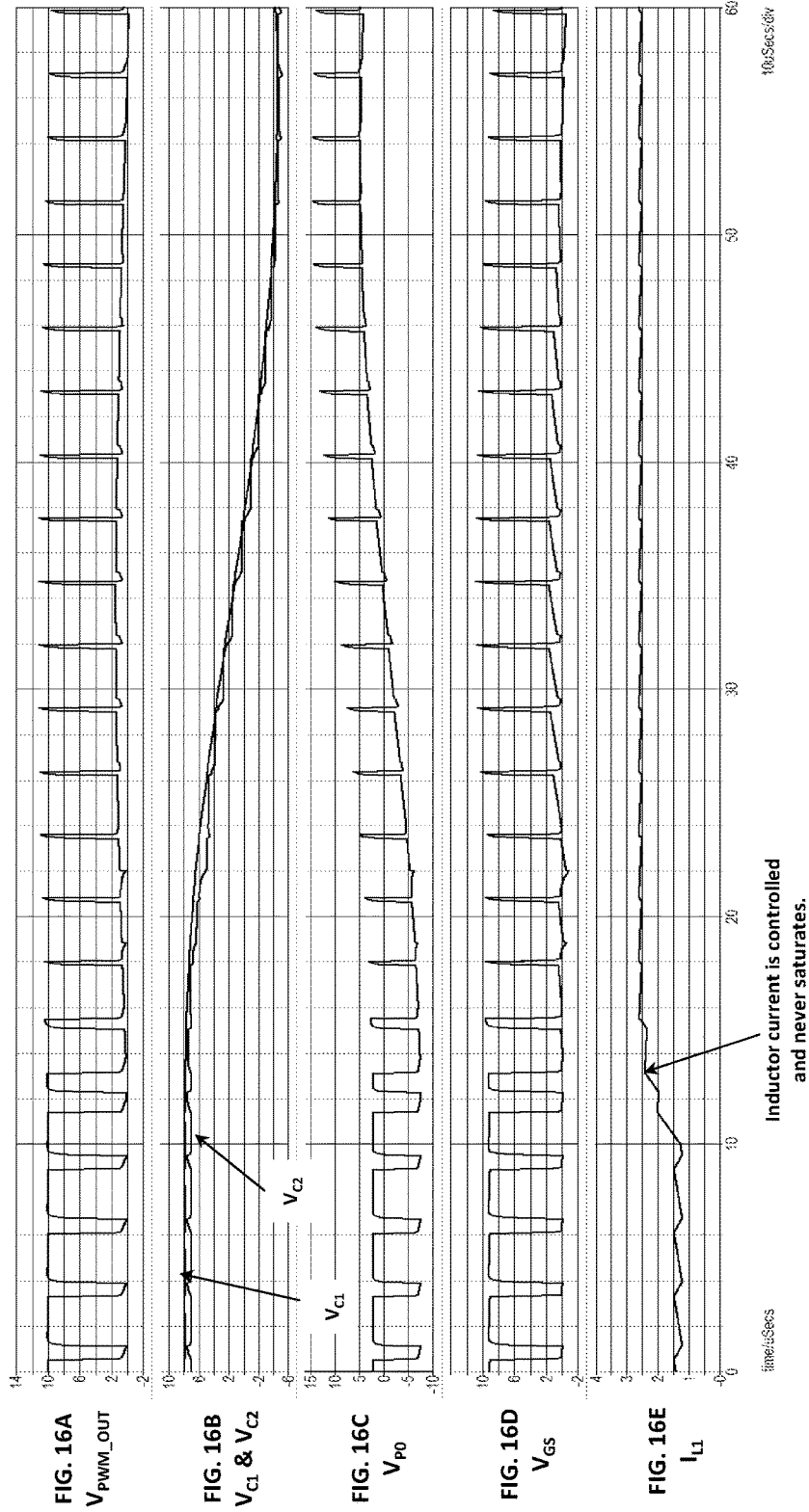

FIG. 15 illustrates a third embodiment of the invention which is similar to Embodiment #1A and #1B, illustrated in FIG. 9 with 9A and 9B, embedded in the DC-restore circuit, and FIG. 12A, which is the simulation schematic for FIG. 9A. In this embodiment, a second secondary winding on the transformer is not used but at the expense of an additional transistor and associated parts. The discussion will assume for purposes of illustration that the voltage $V_{PWM\_OUT}$ at node PWM_OUT is 10 volts when the PWM is ON and zero volts when it is OFF. Numbers will be used for illustrative purposes to enable adapting to other PWMs and DC-restore circuit values.

The primary, P0, of pulse transformer TX0 connects to DC-blocking capacitor C1 as before with TX1. Embodiment #3 circuitry connects to the secondary, S0, of TX0 with an output connected to the junction of DC-restore capacitor C2 and resistor R1 as did Embodiment #1A and #1B. As can be seen by the dot notation, the polarity of S0 is the same as P0 and, in this example, the turns ratio is 1:1.

Capacitor C14 connects to the high side of S0 and through diode D8 to the low side. C14 and D8 operate similarly to C2 and D2 to generate a DC-restored replica of $V_{PWM\_OUT}$ across D8. When $V_{PWM\_OUT}$=10 volts, capacitor C15, which connects to the low side of S0, is charged to a nominal 9.4 volts DC (after about 4 cycles, depending on C15/C14, starting from completely discharged) via diode D9 connected to the junction of C14 and D8 with diode polarities as indicated. When $V_{PWM\_OUT}$=0 volts, the voltage $V_{C15}$ stays at 9.4 volts unless current is drawn from it.

Capacitor C3 connects to the junction of C14 and D8 and sees the replica of $V_{PWM\_OUT}$. It also connects to diode D3 which connects to the positive side of C15 and resistor R3 which connects to the base of a PNP transistor Q7. (C3 and R3 in this embodiment perform a similar timing function to C3 and R3 in FIG. 9A.) The emitter of Q7 connects to the positive side of C15 while its collector connects to current limiting resistor R19. The other side of R19 connects to turn off resistor R20 and the base of NPN transistor Q2. Both the other side of R20 and the emitter of Q2 connect to the low side of Vs, while the collector of Q2 connects to the positive side of capacitor C2. (Q2 performs the same function as Q2 in FIG. 9A to provide a path for capacitor C2 to equilibrate with capacitor C1.)

Starting with $V_{PWM\_OUT}$=10 volts and the positive side of C15 at 9.4 volts, when $V_{PWM\_OUT}$ goes to zero volts, similarly to $V_{GS}$ on Q1, the junction of C14 and D8 drops by 9.4 volts pulling current from the base of Q7 via R3. Initially, if R3=1k, this is about 9.4 mA which turns Q7 on, but decreases with a time constant of R3·C3 until C3 charges up so the base current into Q7 goes to zero. While Q7 is on, the current in the base of Q2 is nearly 9.4 volts/249 ohms=38 ma. This puts Q2 into hard saturation. With a beta of 10, the collector current can be as much as 380 ma to provide a low resistance path from C2 to the low side of $V_{S0}$.

The overall function of Embodiment #3 is the following. As discussed previously in conjunction with FIG. 9A, with the polarities indicated, when the PWM is OFF, $V_{GS}$ on Q1=$V_{C2}-V_{C1}$. During quasi-steady, i.e., the PWM duty cycle is changing slowly, $V_{C1}>V_{C2}$ Q1 is not turned ON and C1 charges C2 via diode D2. When a short circuit or other event causes the PWM to drastically reduce its duty cycle, C1 discharges, with an oscillation caused by the transformer TX0 magnetizing inductance $L_M$ while C2 discharges slowly through R2. After an abrupt drop in duty cycle due to a short circuit or other event, eventually, $V_{C2}>V_{C1}$ so that $V_{GS}>0$ and still later, $V_{GS}>V_{TH}$ and Q1 turns ON when it should be OFF. When PWM goes OFF, this embodiment, the same as Embodiment #1A and #1B, equalizes the voltages on C1 and C2 so that $V_{GS}$=0 in the off state.

This embodiment would not be useful if it kept the voltages equal during the ON state. The values of R3 and C3 need to be adjusted so that Q2 is not kept on longer that a PWM OFF time. (In this numerical example, R3=1k and C3=150 pF) At high PWM frequencies and duty cycles, $T_{OFF}$ can be quite short, e.g., 140 ns. This is long enough provided the current through Q2 is enough to equalize the voltages on C1 and C2. Typically, the voltage difference, $V_{C2}-V_{C1}$, is no more than about 1 volt during quasi-steady state operation and is kept to less after a short circuit. Assuming 1 volt and C2=33 nC, since C>>C2, ΔQ=33 nC so the current required=33 nC/140 ns=236 mA which was easily obtained here.

When the PWM is ON, i.e., $V_{PWM\_OUT}$=10 volts, the junction of C14 and D8 goes to 10 volts which recharges C15 to 9.4 volts as well as discharging C3 into C15 via D3 and turning off Q7, if it was still on. (The junction of R3 and D3 will be +0.6 volts with respect to the emitter of Q7.)

Charging C14 and C15 is an additional load on the PWM. When the PWM goes OFF, it charges C2 and C14 in parallel through D2 and D8, respectively. Since C2=33 nF and C14=10 nF, the additional load should not be significant. When the PWM goes ON, it charges the Ciss of Q1 and C15 in parallel. If Ciss=1 nF, the charge transferred to it is 10 volts×1 nF=10 nQ. The charge transferred to C15 can be calculated by noting that Q7 conducts 36 mA for 0.2 μsec=7.2 nQ. During this time, node $V_{C1}$s sags by 7.2 nQ/4.7 nF=1.6 volts. Thus, since the current through Q7 and Q2 is more than enough, C15 could be reduced if the PWM is loaded too much.

A simulation was run using Embodiment #3 without diode D1 which is optional. The results illustrated in FIGS. 16A-16E are nearly indistinguishable from the results for Embodiment #1A shown in FIGS. 10A-10E. However, this embodiment has disadvantages compared to Embodiment #1A. It requires an extra active component Q7 and associated parts but only eliminates one winding on a pulse transformer.

Sensible Variations:

Having described detailed examples which are believed to be the best mode of building a SMPS, designers of such will appreciate that the examples of the invention will still work after making sensible variations. In particular, it is not necessary to use the exact values used for purposes of the software simulator.

In place of the illustrated signal diodes, Schottky or any other rectifying device could be used. Conceivably, Zener diodes with a high enough voltage could be used as a rectifier only.

The function of the power MOSFET switch Q1 could be satisfied with a variety of voltage controlled semiconductor switches including, IGBTs and GaN FETs, with suitable fairly obvious adaptions. For example, IGBTs require gate-to-emitter voltage of 15 volts to reduce their on resistance to a minimum. This can be obtained by changing the turns ratio of transformer TX1 to 1:1.5 for $V_{CC}$=10 volts. On the other hand, GaN FETs require +5 volts to turn on fully, but have a maximum $V_{GS}$=6 volts. So, the turns ratio should change to 1:0.5. Capacitors C1 and C2 could be changed in proportion to different values of $<C_{ISS}>$. As another example, one could use two power switches in parallel to make a combined single switch.

DC-blocking capacitor C1 can be relocated so that it connects to the low side of primary winding P1 and PWM ground, provided that diode D1 is oriented with its anode at PWM ground. Similarly, DC-restore capacitor C2 can be connected to the low side of the secondary winding $V_{S0}$ or $V_{S1a}$ that drives the gate of MOSFET Q1 instead of the high side.

Damping resistor R1 is good practice, but may not be required in every application if leakage inductance is minimized and wire connections are kept short. Bleed-off resistor R2 is also good practice, but the start-up routine of some PWMs does not require it.

The function of NPN transistor or MOSFET Q2 in FIG. 9 with 9A or 9B can be replaced by any small signal switch.

Generally, pulse transformers are wound on soft ferrite cores, but any transformer that transmits a pulse in the psec range could be used. Preferably, a bi-filar winding is used for the primary P1 and first secondary S1a to obtain good coupling, but this is not so important for the second secondary S1b. It is also not necessary that transformer TX1 be wound on a single core. Two separate cores could be used so that one has in effect two transformers. The turns ratio does not have to be 1:1:1. The turns ratio P1:S1a can be greater than or less than 1:1. Increasing ratio is beneficial to achieve full enhancement of Q1 with low output pulse magnitudes from the PWM. Decreasing the ratio is beneficial to keep from violating the $V_{GS}$ derating voltage of Q1 with relatively high output pulse magnitudes from the PWM. The turns ratio P1:S1b also need not be restricted to 1:1. This ratio can be greater than or less than 1:1; however, the main goal is to choose a ratio that applies a voltage across D3 in FIG. 9A during $T_{OFF}$ that is sufficiently higher than the $V_{BE}$ of Q2 so that it turns on and remains on for a sufficient time to insure that C2 is adequately discharged every cycle. This is important especially over a range of operating temperatures where $V_{BE}$ will change.

Referring to FIG. 13, the function of the PNP transistor Q6 can be replaced by any switch (SW2) that is connected across both terminals of C2 with the function of discharging C2 through the switch element when the converter receives a shutdown or disable command. For example, a P-channel MOSFET could be used where the source and drain terminals of the MOSFET are substituted for the emitter and collector terminals of the PNP, respectively. The resistors R17 and R18 would still typically be used in the drive circuit for a P-Channel MOSFET; however, their values may need to be adjusted to provide sufficient gate-to-source voltage for Q6 to turn it on, and to ensure that the gate-source voltage of Q6 is forced to zero when Q6 should be off.

The drive circuit that turns Q6 on and off can be configured in many different ways, and it is not considered as part of the claim for the functionality of Q6. If it is a PNP transistor, then any interfacing drive circuit that can be configured to draw base current or interrupt base current would be sufficient to ensure functional operation of Embodiment #2. Similarly, if Q6 is a P-channel MOSFET, then any interfacing drive circuit that applies or removes gate-to-source voltage to Q6 would be sufficient to ensure functional operation of Embodiment #2. For example, if an active-high disable signal originates from an input under-voltage shutdown detection circuit or perhaps a sequencing circuit, then the Q6 drive circuit could be a NPN transistor that is driven directly from the active-high disable signal and whose collector draws current from the base of Q6 (an example is a PNP transistor) via R17 therefore turning Q6 on and discharging C2. Another circuit path would be needed from the original disable signal to also disable the PWM in order to stop the PWM output pulses. There are several different ways to disable a PWM, and some types of PWMs have dedicated enable/disable inputs, but a common method used for very generic PWMs is to pull the current sense, pin CS for UI, above the 1V over-current threshold.

Lastly, the working examples used a buck converter topology but the invention could be used whenever an isolated gate drive is desired, as shown in FIG. 17, which was derived from FIG. 9 by inserting the circuitry in FIG. 9A into module X3 with buck topology components (L1, $D_{OUT}$, $C_{OUT}$, and $R_{LOAD}$) removed. Winding notation, P1, S1a, and S1b, is also used. Operation is as described for FIGS. 9 and 9A. Examples of topologies where the power switch is not ground referenced include: inverting buck-boost, two-switch forward, half-bridge, full bridge, and various forward topology configurations. Bridge configurations have a ground referenced switch, sometimes called low side, and a switch connected to $V_{IN}$, hence the term high side. Another example of a power switch not being ground referenced is synchronous rectification where a rectifying or free-wheeling diode is replaced by a MOSFET or another type of power switch.

Figure 1:
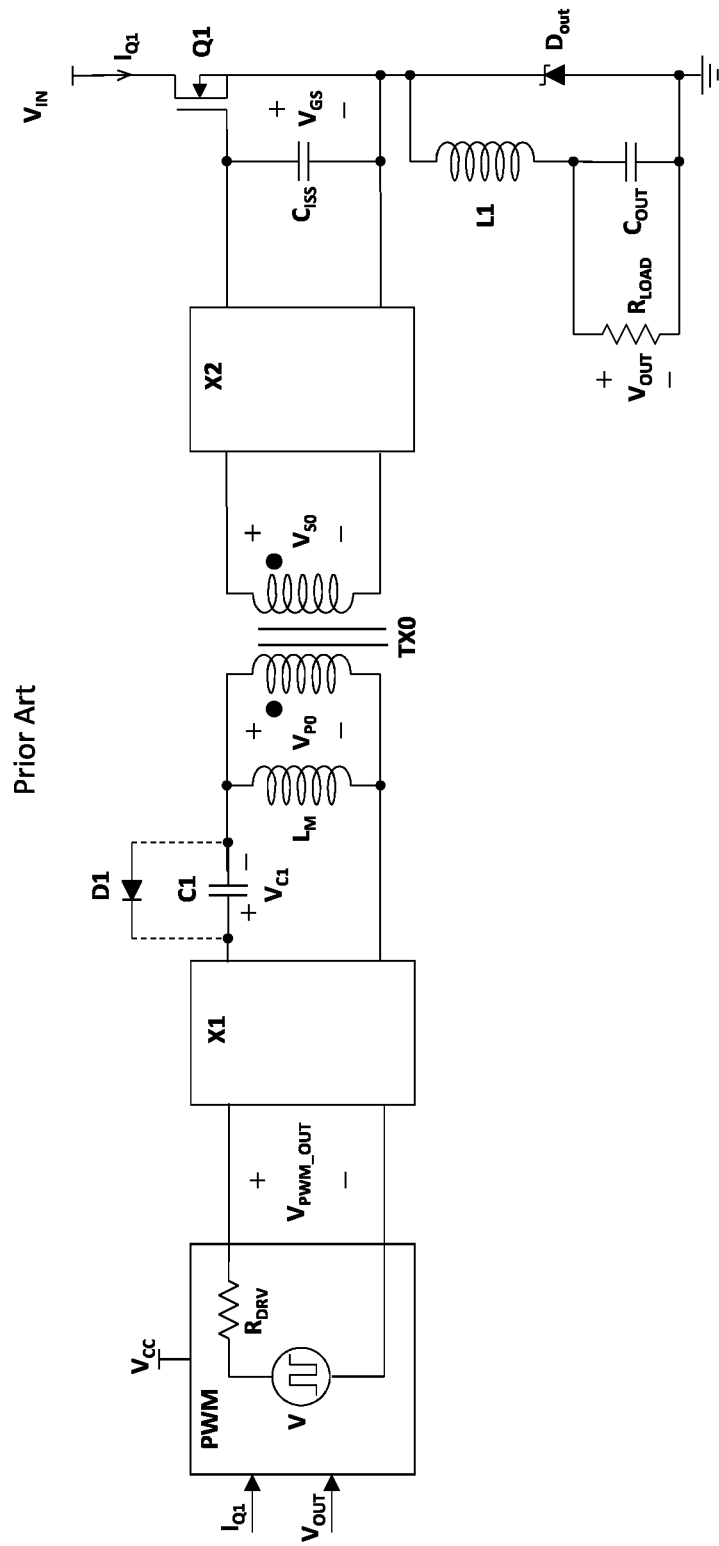
FIG. 1 is a schematic illustrating a generic transformer isolated high side gate driver.

The boost topology can be obtained, with reference to FIG. 1 by swapping Q1 for D4, L1 for Q1, and D4 for L1 with suitable polarities. Since Q1 is ground referenced, a boost converter does not normally need an isolated gate driver, but using one allows the use of separate grounds which might reduce noise due to circulating ground currents, especially when the PWM is located on a different circuit card from the power switch or if there is otherwise a long physical separation. Other topologies with ground referenced switches include: SEPIC, flyback, one switch forward, push-pull, and Cuk.

The present invention has been described with reference to particular embodiments having various features. In light of the disclosure provided above, it will be apparent to those skilled in the art that various modifications and variations can be made in the practice of the present invention without departing from the scope or spirit of the invention. One skilled in the art will recognize that the disclosed features may be used singularly, in any combination, or omitted based on the requirements and specifications of a given application or design. When an embodiment refers to "comprising" certain features, it is to be understood that the embodiments can alternatively "consist of" or "consist essentially of" any one or more of the features. Other embodiments of the invention will be apparent to those skilled in the art from consideration of the specification and practice of the invention.

It is noted in particular that where a range of values is provided in this specification, each value between the upper and lower limits of that range is also specifically disclosed. The upper and lower limits of these smaller ranges may independently be included or excluded in the range as well. The singular forms "a," "an," and "the" include plural referents unless the context clearly dictates otherwise. It is intended that the specification and examples be considered as exemplary in nature and that variations that do not depart from the essence of the invention fall within the scope of the invention. Further, all of the references cited in this disclosure including issued patents and published patent applications are each individually incorporated by reference herein in their entireties and as such are intended to provide an efficient way of supplementing the enabling disclosure of this invention as well as provide background detailing the level of ordinary skill in the art.

The invention claimed is:

1. A switched mode power supply (SMPS) comprising:
a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns off said switch (Q1) with a voltage below said threshold voltage, and a drive section that provides an interface between said PWM and said switch;
wherein said drive section has an input, an output, and an isolation transformer (TX1) disposed in between that isolates the drive section output from the input and having a primary winding ($V_{P1}$), a first secondary winding ($V_{S1a}$), and a second secondary winding ($V_{S1b}$) wherein voltage from said second secondary winding ($V_{S1b}$) is opposite in polarity to that of said first secondary winding ($V_{S1a}$) output;
wherein said PWM output is connected to said primary winding ($V_{P1}$) through a DC-blocking capacitor (C1);
wherein said first secondary winding ($V_{S1a}$) high side is connected to the positive input terminal (GATE) of said power switch (Q1) via a DC-restore capacitor (C2), said first secondary winding ($V_{S1a}$) low side is connected to the negative input terminal (SOURCE) of said switch (Q1) and, optionally, a DC-restore diode (D2) is added with its cathode connected to said DC-restore capacitor (C2) terminal opposite the capacitor's connection to said first secondary winding ($V_{S1a}$) high side and with its anode connected to said first secondary winding ($V_{S1a}$) low side; and
wherein said second secondary winding ($V_{S1b}$) high side is connected to a first control terminal of a DC-restore capacitor (C2) switch module (X3) and said second secondary winding ($V_{S1b}$) low side is connected to a second control terminal of said switch module (X3) and to said first secondary winding ($V_{S1a}$) low side, wherein said switch module (X3) has a switch connected across said DC-restore capacitor (C2), from the capacitor terminal opposite said first secondary winding ($V_{S1a}$) high side to said first secondary winding ($V_{S1a}$) low side, wherein said switch module (X3) has timing circuitry which turns off said DC-restore capacitor switch module (X3) after a preset time;
wherein after a voltage pulse is received from said second secondary winding ($V_{S1b}$), said DC-restore capacitor switch module (X3) connects said DC-restore capacitor (C2) to said first secondary winding ($V_{S1a}$) low side, but only until the preset time has elapsed.

2. The SMPS of claim 1 further including a diode (D1) connected in parallel with said DC-blocking capacitor (C1) with its cathode oriented toward said positive output of said PWM.

3. The SMPS of claim 1 wherein said DC-restore capacitor switch module (X3) comprises an NPN transistor (Q2) and said timing circuitry comprises a timing capacitor (C3) connected to said second secondary winding ($V_{S1b}$) high side and to a timing resistor (R3) connected to said transistor (Q2) base whose collector is connected to said DC-restore capacitor (C2) opposite the capacitor's connection to said first secondary winding ($V_{S1a}$) high side and whose emitter is connected to both of said secondary winding ($V_{S1a}$, $V_{S1b}$) low sides, further having the cathode of a diode (D3) connected to the junction of said time constant capacitor (C3) and said timing resistor (R3) and having its anode connected to the emitter of said NPN transistor (Q2).

4. The SMPS of claim 3 further including a diode (D1) connected in parallel with said DC-blocking capacitor (C1) with its cathode oriented toward said positive output of said PWM.

5. The SMPS of claim 3 further including Md DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side.

6. The SMPS of claim 1 wherein said DC-restore switch module (X3) comprises an N-channel MOSFET (Q2) and said timing circuitry comprises a timing capacitor (C3) connected to said second secondary winding ($V_{S1b}$) high side and to the gate of said MOSFET (Q2) and a timing resistor (R3) connected between the gate of said MOSFET (Q2) and said second secondary winding ($V_{S1b}$) low side which is connected to the source of said MOSFET (Q2) whose drain is connected to said DC-restore capacitor (C2) opposite the capacitor's connection to said first secondary winding ($V_{S1a}$) high side.

7. The SMPS of claim 6 further including a diode (D1) connected in parallel with said DC-blocking capacitor (C1) with its cathode oriented toward the positive output of said PWM.

8. The SMPS of claim 6 further including said DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side.

9. The SMPS of claim 6 wherein the cathode of a diode (D3) is connected to the junction of said timing capacitor (C3) and said timing resistor (R3) and whose anode is connected to said second secondary winding (S1b) low side.

10. The SMPS of claim 1, further including a diode (DI) connected across said DC-blocking capacitor (C1) with its cathode oriented toward said positive output of said PWM;
further including a DC-restore diode (D2) with its anode connected to said first secondary winding ($V_{S1a}$) low side and its cathode connected to said DC-restore capacitor (C2) opposite the capacitor's connection to said first secondary winding ($V_{S1a}$) high side; and
a DC-restore capacitor shorting switch (SW2) connected across said DC-restore capacitor (C2) having control terminals that turn said switch on after receiving a signal that said PWM has shut down.

11. The SMPS of claim 10 wherein said DC-restore capacitor shorting switch (SW2) comprises a transistor (Q6), which is a PNP transistor having its collector connected to said DC-restore capacitor (C2) at its connection to said first secondary winding ($V_{S1a}$) high side, its emitter connected to said DC-restore capacitor (C2) at its connection to the cathode of said DC-restore diode (D2), and its base connected through a resistor (R17) to a disable switch (Q4) that connects said resistor (R17) to said PWM ground immediately after or concurrently when said PWM shuts down.

12. The SMPS of claim 10 wherein said second DC-restore switch comprises a transistor (Q6), which is a P-channel MOSFET transistor having its drain connected to said DC-restore capacitor (C2) at its connection to said first secondary winding ($V_{S1a}$) high side, its source connected to said DC-restore capacitor (C2) at its connection to the cathode of said DC-restore diode (D2), and its gate connected through a resistor (R17) to a disable switch (Q4) that connects said resistor (R17) to said PWM ground immediately after or concurrently when said PWM shuts down.

13. A switched mode power supply (SMPS) comprising:
a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch;
wherein said drive section has an input, an output, and an isolation transformer (TX1) disposed in between that isolates the drive section output from the input and having a primary winding ($V_{P1}$) and at least one secondary winding ($V_{S1a}$);
wherein said PWM output is connected to said primary winding ($V_{P1}$) through a DC-blocking capacitor (C1);
a diode (D1) connected across said DC-blocking capacitor (C1) with its cathode oriented toward said PWM positive output;
wherein said at least one secondary winding ($V_{S1a}$) high side is connected to the positive input terminal (GATE) of said power switch (Q1) via a DC-restore capacitor (C2), said at least one secondary winding ($V_{S1a}$) low side is connected to the negative input terminal (SOURCE) of said switch (Q1) as well as to the anode of a DC-restore diode (D2) with its cathode connected to said DC-restore capacitor (C2) terminal opposite the capacitor's connection to said first secondary winding ($V_{S1a}$) high side and with its anode connected to said first secondary winding ($V_{S1a}$) low side; and
a DC-restore capacitor shorting switch (SW2) connected across said DC-restore capacitor (C2) having control terminals that turn said switch on after receiving a signal that turns off said PWM output.

14. The SMPS of claim 13 wherein said DC-restore capacitor shorting switch (SW2) comprises a transistor (Q6), which is a PNP transistor having its collector connected to said DC-restore capacitor (C2) at its connection to said first secondary winding ($V_{S1a}$) high side, its emitter connected said DC-restore capacitor (C2) at its connection to the cathode of said DC-restore diode (D2), and its base connected through a resistor (R17) to a disable switch (Q4) that connects said resistor to said PWM ground immediately after or concurrently when said PWM shuts down.

15. The SMPS of claim 13 wherein said second DC-restore switch comprises a P-channel MOSFET transistor (Q6) having its drain connected to said DC-restore capacitor (C2) at its connection to said first secondary winding ($V_{S1a}$) high side, its source connected said DC-restore capacitor (C2) at its connection to the cathode of said DC-restore diode (D2), and its gate connected through a resistor (R17) to a disable switch (Q4) that connects said resistor to said PWM ground immediately after or concurrently when said PWM shuts down.

16. A switched mode power supply (SMPS) comprising:
a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch;
wherein said drive section has an input, an output, and an isolation transformer (TX0) disposed in between that isolates the drive section output from the input and having a primary winding ($V_{P0}$) and a secondary winding ($V_{S0}$);
wherein said PWM output is connected to said primary winding ($V_{P0}$) through a DC-blocking capacitor (C1);
wherein said secondary winding ($V_{S0}$) high side is connected to the positive input terminal (GATE) of said power switch (Q1) via a DC-restore capacitor (C2), said secondary winding ($V_{S0}$) low side is connected to the negative input terminal (SOURCE) of said switch (Q1) and, optionally, a DC-restore diode (D2) is added with its cathode connected to said DC-restore capacitor (C2) terminal opposite the capacitor's connection to said first secondary winding ($V_{S0}$) high side and with its anode connected to said first secondary winding ($V_{S0}$) low side; and
wherein said secondary winding ($V_{S0}$) is further connected to the control terminals of a DC-restore capacitor (C2) switch module (X4), wherein said switch module (X4) has a switch connected across said DC-restore capacitor (C2), from the capacitor terminal opposite said secondary winding ($V_{S0}$) high side to said secondary winding ($V_{S0}$) low side, wherein said switch module (X4) has timing circuitry which turns off said DC-restore capacitor switch module (X4) after a preset time;
wherein after a voltage pulse is received from said second secondary winding ($V_{S0}$), said DC-restore switch module connects said DC-restore capacitor (C2) to said secondary winding ($V_{S0}$) low side, which nuts said DC-restore capacitor (C2) in parallel with said DC-blocking capacitor (C1) to keep $V_{C2}$ proportional to $V_{C1}$ as scaled by the transformer (TX0) turns ratio, but only until the preset time has elapsed.

17. The SMPS of claim 16 wherein said DC-restore capacitor switch module (X4) comprises a diode-pumped DC supply (C14, D8, D9, C15) that powers a level translator (Q7) turned on and off by timing circuitry (C3, R3, D3) both fed by pulses from said secondary winding ($V_{S0}$), controlling in turn a DC-restore capacitor switch (Q2).

18. The SMPS of claim 16 wherein said DC-restore capacitor switch module (X4) comprises:
a coupling capacitor (C14) connected to said secondary winding ($V_{S0}$) high side and the cathode of a diode (DS) connected to said secondary winding ($V_{S0}$) low side, the junction of the two being connected to the anode of a rectifying diode (D9) which is connected to a DC-supply capacitor (C15), which is also connected to said secondary winding ($V_{S0}$) low side, the cathode of said rectifying diode further connected to the cathode of a voltage limiting diode (D3) and the emitter of a PNP transistor;

a timing capacitor (C3) connected to the anode of said rectifying diode (D9) and the anode of said voltage limiting diode (D3) and a timing resistor (R3) connected to the base of said PNP transistor; and a current limiting resistor (R19) connected to the collector of said PNP transistor, the other side connected to the base of an NPN transistor (Q2) and a turn-off resistor (R20) which is connected to said secondary winding ($V_{S0}$) low side and the emitter of said NPN transistor whose collector is connected to said DC-restore capacitor (C2) opposite the capacitor's connection to the secondary winding ($V_{S0}$) high side.

19. The SMPS of claim 16 further including a diode (DI) connected in parallel with said DC-blocking capacitor (C1) with its cathode oriented toward the positive output of said PWM.

20. The SMPS of claim 19 further including a DC-restore diode (D2) whose anode is connected to a junction of said secondary winding ($V_{S0}$) low side and the negative input terminal (SOURCE) of said switch (Q1) with its cathode connected to said DC-restore capacitor (C2) opposite the capacitor's connection to the high side of said secondary winding ($V_{S0}$).

21. A switched mode power supply (SMPS) comprising:
a pulse-width-modulator (PWM) with a PWM ground referenced positive output, a power section with a power switch (Q1) having a switch control that turns on said switch with a positive voltage at a positive input terminal (GATE) with respect to a negative input terminal (SOURCE) above a threshold voltage and turns said switch (Q1) off with a voltage below said threshold voltage, and a drive section that provides an interface between said PWM and said switch;

wherein said drive section has an input, an output, and an isolation transformer (TX0, TX1) disposed in between that isolates the drive section output from the input and having a primary winding ($V_{P0}$, $V_{P1}$) and one or more secondary windings ($V_{S0}$, $V_{S1a}$, $V_{S1b}$);

wherein said PWM output is connected to said primary winding ($V_{P0}$, $V_{P1}$) through a DC-blocking capacitor (C1);

wherein one secondary winding ($V_{S0}$, $V_{S1a}$) high side is connected as a gate driver to the positive input terminal (GATE) of said power switch (Q1) via a DC-restore capacitor (C2), said secondary winding gate driver ($V_{S0}$, $V_{S1a}$) low side is connected to the negative input terminal (SOURCE) of said switch (Q1), and, optionally, a DC-restore diode (D2) is added with its cathode connected to said DC-restore capacitor (C2) terminal opposite the capacitor's connection to said first secondary winding ($V_{S1a}$) high side and with its anode connected to said first secondary winding ($V_{S0}$, $V_{S1a}$) low side; and a DC-restore capacitor (C2) switch module (X3, X4) having a switch connected across said DC-restore capacitor (C2), from the capacitor terminal opposite said secondary winding gate driver ($V_{S0}$, $V_{S1a}$) high side to said secondary winding gate driver ($V_{S0}$, $V_{S1a}$) low side, wherein said switch module (X3, X4) is configured to accept inputs from one of said one or more secondary windings ($V_{S0}$, $V_{S1a}$, $V_{S1b}$) as a control winding to trigger timing circuitry that controls said DC-restore capacitor switch module (X3, X4) switch;

wherein after a voltage pulse is received from said control winding ($V_{S0}$, $V_{S1a}$, $V_{S1b}$), said DC-restore switch module connects said DC-restore capacitor (C2) to said secondary winding gate driver ($V_{S0}$, $V_{S1a}$) low side, which puts said DC-restore capacitor (C2) in parallel with said DC-blocking capacitor C1) to keep $V_{C2}$ proportional to $V_{C1}$ as scaled by the transformer (TX0, TX1) turns ratio, but only until a preset time has elapsed.

22. The SMPS of claim 21 wherein said gate driver and said DC-restore capacitor (C2) switch module (X4) utilize the same winding.

23. The SMPS of claim 21 further including a diode (D1) connected in parallel with said DC-blocking capacitor (C1) with its cathode oriented toward the positive output of said PWM.

24. The SMPS of claim 21 further including said DC-restore diode (D2) with its anode connected to said secondary winding gate driver ($V_{S0}$, $V_{S1a}$) low side and its cathode connected to said DC-restore capacitor (C2) opposite the capacitor's connection to said secondary winding gate driver ($V_{S0}$, $V_{S1a}$) high side.

* * * * *